(12) United States Patent
Akimoto

(10) Patent No.: US 11,476,308 B2
(45) Date of Patent: Oct. 18, 2022

(54) METHOD FOR MANUFACTURING IMAGE DISPLAY DEVICE AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 93 days.

(21) Appl. No.: 16/824,041

(22) Filed: Mar. 19, 2020

(65) Prior Publication Data

US 2020/0303471 A1 Sep. 24, 2020

(30) Foreign Application Priority Data

Mar. 22, 2019 (JP) .............................. JP2019-055382

(51) Int. Cl.
*H01L 27/32* (2006.01)
*H01L 31/107* (2006.01)

(52) U.S. Cl.
CPC ........ *H01L 27/3211* (2013.01); *H01L 27/322* (2013.01); *H01L 31/107* (2013.01); *H01L 27/3241* (2013.01)

(58) Field of Classification Search
CPC combination set(s) only.
See application file for complete search history.

(56) References Cited

U.S. PATENT DOCUMENTS

| 9,105,813 | B1 | 8/2015 | Chang |
| 2005/0255616 | A1 | 11/2005 | Childs et al. |
| 2008/0102545 | A1 | 5/2008 | Yamagata et al. |
| 2009/0078963 | A1 | 3/2009 | Khodja |
| 2010/0197054 | A1 | 8/2010 | Yonehara |
| 2012/0161183 | A1 | 6/2012 | Ubahara et al. |
| 2018/0175268 | A1 | 6/2018 | Moon et al. |
| 2019/0052061 | A1 | 2/2019 | Kondo |
| 2019/0165227 | A1* | 5/2019 | Oya ........................ H01L 33/46 |
| 2019/0355766 | A1 | 11/2019 | Zhang et al. |

FOREIGN PATENT DOCUMENTS

| EP | 3 633 657 A1 | 4/2020 |
| JP | 2002-057283 A | 2/2002 |
| JP | 2002-141492 A | 5/2002 |
| JP | 2005-521205 A | 7/2005 |
| JP | 2007-242645 A | 9/2007 |
| JP | 2008-147608 A | 6/2008 |
| JP | 2009-094144 A | 4/2009 |

(Continued)

*Primary Examiner* — Suberr L Chi

(74) *Attorney, Agent, or Firm* — Foley & Lardner LLP

(57) ABSTRACT

A method for manufacturing an image display device includes: preparing a substrate, the substrate comprising a semiconductor layer, the semiconductor layer comprising a light emitting layer, the semiconductor layer being formed on a first substrate; bonding the semiconductor layer to a second substrate, the second substrate comprising a circuit that comprises a circuit element; forming a light emitting element by etching the semiconductor layer; forming an insulating film covering the light emitting element; forming a via reaching the circuit through the insulating film; and electrically connecting the light emitting element and the circuit element through the via, the via connecting the light emitting element and the circuit element provided in different layers.

8 Claims, 24 Drawing Sheets

(56) References Cited

FOREIGN PATENT DOCUMENTS

| | | |
|---|---|---|
| JP | 2014-072215 A | 4/2014 |
| JP | 2016-219780 A | 12/2016 |
| JP | 2018-006502 A | 1/2018 |
| JP | 2018-101785 A | 6/2018 |
| JP | 2018-205456 A | 12/2018 |
| JP | 2019-046931 A | 3/2019 |
| JP | 2019-062098 A | 4/2019 |
| WO | WO-2008/155940 A1 | 12/2008 |
| WO | WO-2012/091007 A1 | 7/2012 |
| WO | WO-2018/132070 A1 | 7/2018 |
| WO | WO-2019/049360 A1 | 3/2019 |

\* cited by examiner

METHOD FOR MANUFACTURING IMAGE DISPLAY DEVICE AND IMAGE DISPLAY DEVICE

CROSS-REFERENCE TO RELATED APPLICATION

This application is based upon and claims priority to Japanese Patent Application No. 2019-055382, filed on Mar. 22, 2019, the entire contents of which are incorporated herein by reference.

FIELD

Embodiments of the invention described herein relate to a method for manufacturing an image display device and the image display device.

BACKGROUND

It is desired to realize a thin image display device with high luminance, wide viewing angle, high contrast, and low power consumption. In order to respond to such market demand, development of a display device using a self-light emitting element is in progress.

The appearance of a display device using a micro LED, which is a fine light emitting element, is expected as a self-light emitting element. As a method for manufacturing a display device using micro LEDs, a method of sequentially transferring individually formed micro LEDs to a drive circuit has been introduced. However, as the number of micro LED elements increases as the image quality increases to full HD, 4K, 8K, etc., a large number of micro LEDs are individually formed and sequentially transferred to the substrate on which the drive circuit and the like are formed. An enormous amount of time is required for the transfer process. In addition, poor connection between the micro LED and the drive circuit or the like may occur, resulting in a decrease in yield.

A technique is known in which a semiconductor layer including a light emitting layer is grown on a Si substrate, and electrodes are formed on the semiconductor layer and then bonded to a circuit substrate on which a drive circuit is formed (for example, JP 2002-141492 A (Kokai)).

SUMMARY

According to one embodiment of the invention, a method for manufacturing an image display device and the image display device are provided, in which transferring process of a light emitting element is reduced and a yield is improved.

According to one embodiment of the invention, a method for manufacturing an image display device is disclosed. The method includes preparing a substrate that includes a semiconductor layer. The semiconductor layer includes a light emitting layer. The semiconductor layer is formed on a first substrate. The method can include bonding the semiconductor layer to a second substrate. The second substrate has a circuit that includes a circuit element. The method can include forming a light emitting element by etching the semiconductor layer, forming an insulating film covering the light emitting element, and forming a via reaching the circuit through the insulating film. Additionally, the method can include electrically connecting the light emitting element and the circuit element through the via. The via connects the light emitting element and the circuit element provided in different layers.

According to another embodiment of the invention, an image display device includes a circuit element, a first interconnect layer electrically connected to the circuit element, a first insulating film covering the circuit element and the first interconnect layer, a light emitting element disposed on the first insulating film, a second insulating film covering at least a part of the light emitting element, a second interconnect layer electrically connected to the light emitting element and disposed on the second insulating film; and a first via extending through the first insulating film and the second insulating film, and electrically connecting the first interconnect layer and the second interconnect layer.

According to another embodiment of the invention, an image display device includes a plurality of transistors, a first interconnect layer electrically connected to the plurality of transistors, a first insulating film covering the plurality of transistors and the first interconnect layer, a first semiconductor layer of a first conductivity type disposed on the first insulating film, a light emitting layer disposed on the first semiconductor layer, a second semiconductor layer of a second conductivity type different from the first conductivity type disposed on the light emitting layer, a second insulating film covering the first insulating film, the light emitting layer and the first semiconductor layer, and covering at least a part of the second semiconductor layer, a second interconnect layer connected to a transparent electrode that is disposed on a plurality of exposed surfaces of the second semiconductor layer, the plurality of exposed surfaces being exposed from the second insulating film and corresponding to the plurality of transistors respectively, and a first via extending through the first insulating film and the second insulating film, and electrically connecting a first conductor of the first interconnect layer and a second conductor of the second interconnect layer.

DETAILED DESCRIPTION

Figure 1:
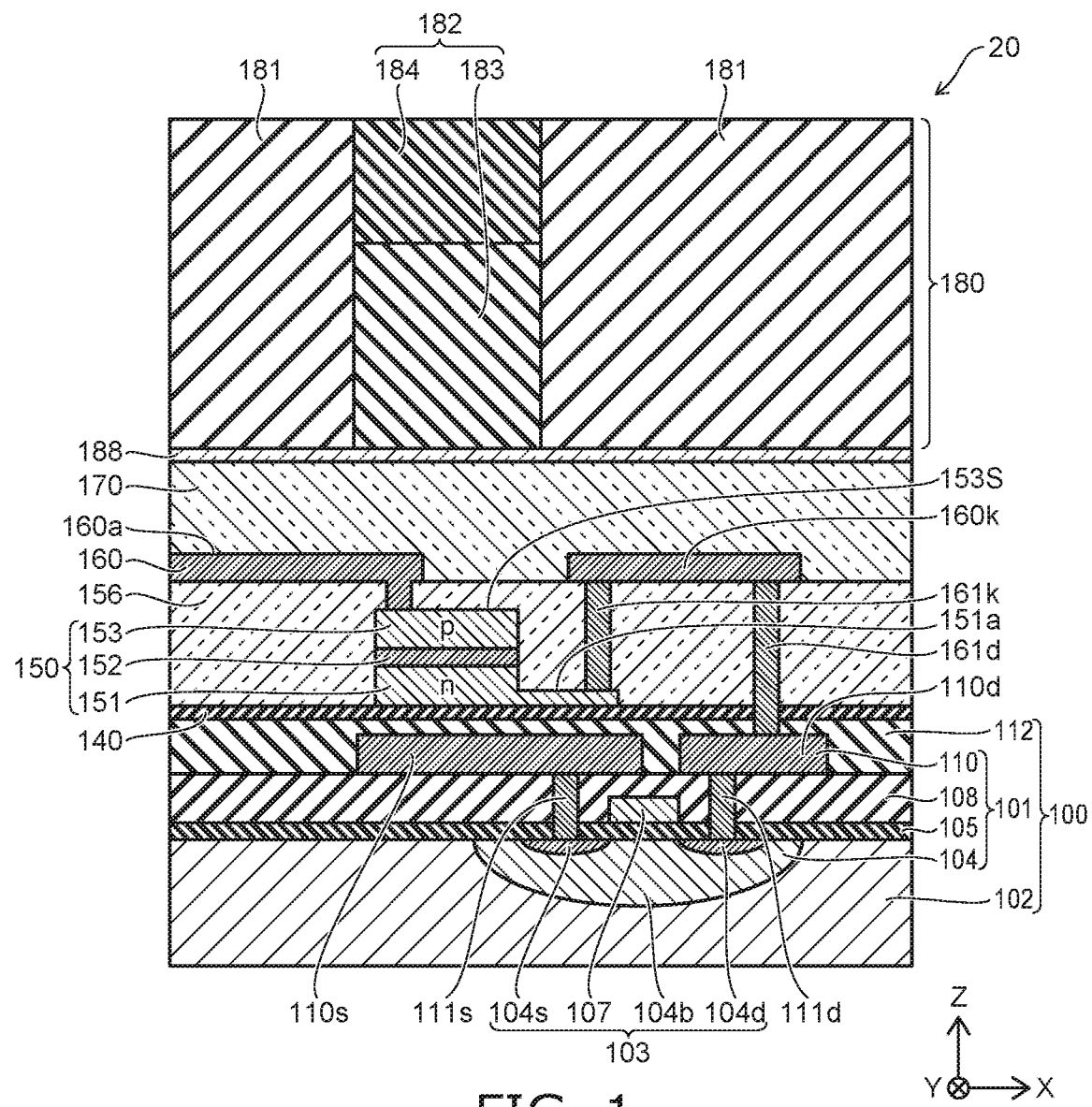
FIG. 1 is a schematic cross sectional view illustrating a portion of an image display device according to a first embodiment.

Various embodiments are described below with reference to the accompanying drawings.

The drawings are schematic and conceptual, and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in antecedent previous drawing are marked with the same reference numerals, and a detailed description is omitted as appropriate.

First Embodiment

FIG. 1 is a schematic cross sectional view illustrating a portion of an image display device according to a first embodiment.

FIG. 1 schematically shows the configuration of a subpixel 20 of the image display device of the present embodiment. A subpixel 10 forming the image displayed in the image display device is configured from multiple subpixels 20. The following description may be made using an XYZ three-dimensional coordinate system. The subpixels 20 are arranged on a two-dimensional plane. The two-dimensional plane in which the subpixels 20 are arranged is defined as an XY plane. The subpixels 20 are arranged along the X-axis direction and the Y-axis direction.

The subpixel 20 has a light emitting surface 153S substantially parallel to the XY plane. The light emitting surface 153S mainly outputs light in the positive direction of the Z-axis orthogonal to the XY plane.

FIG. 1 schematically shows a cross section when the subpixel 20 is cut along a plane parallel to the XZ plane. This cross-sectional view is an arrow cross-section taken along the line A-A' of FIG. 4 described later.

As shown in FIG. 1, the subpixel 20 of the image display device includes a transistor 103, a first interconnect layer 110, a first interlayer insulating film (first insulating film) 112, a light emitting element 150, and a second interlayer insulating film (second insulating film) 156, a second interconnect layer 160, and a via 161d. The subpixel 20 further includes a color filter 180. The color filter (wavelength conversion member) 180 is provided on the surface resin layer 170 via a transparent thin film adhesive layer 188. The surface resin layer 170 is provided on the light emitting element 150, the interlayer insulating film 156, and the interconnect layer 160.

Figure 3:
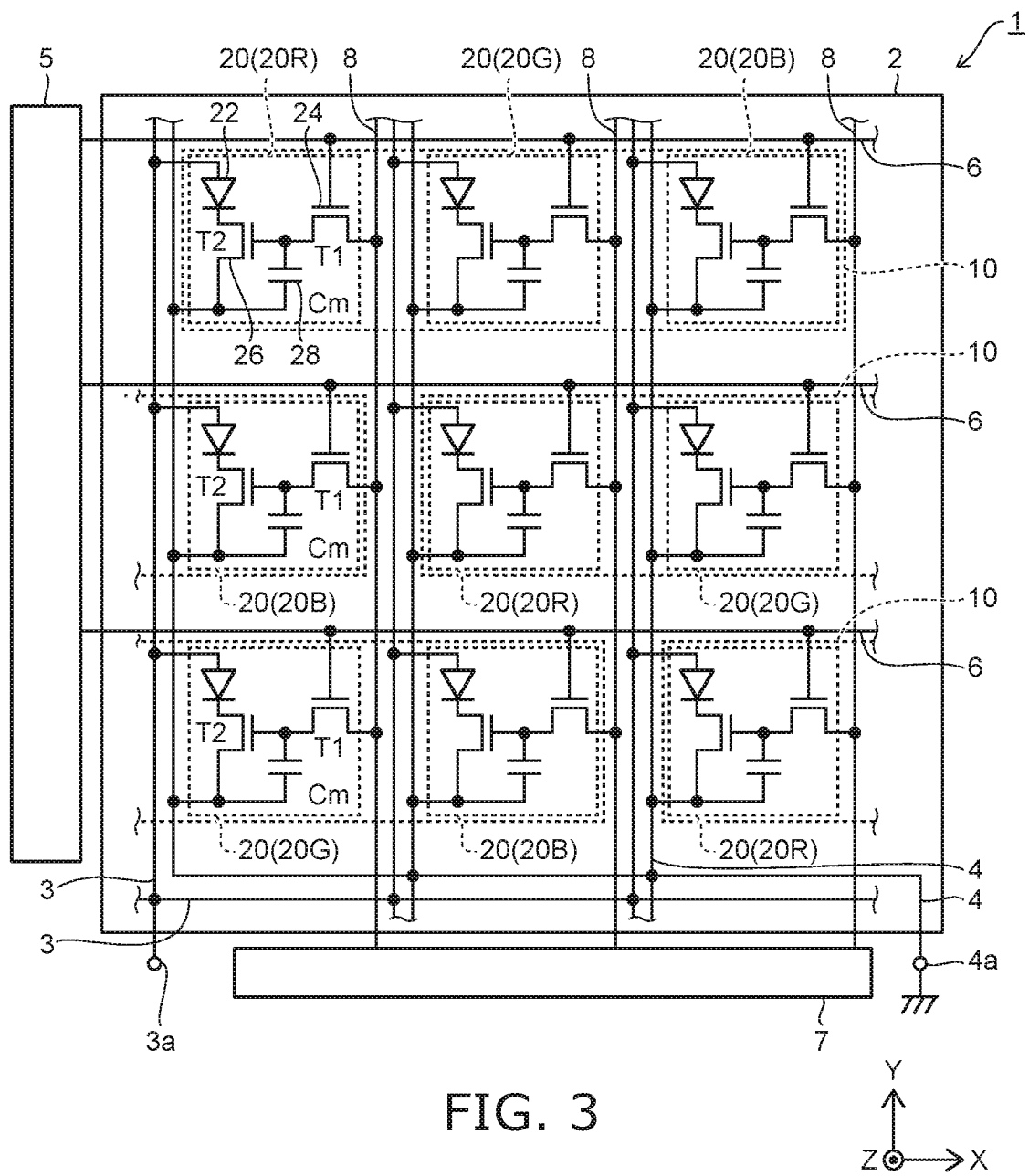
FIG. 3 is a schematic block diagram illustrating the image display device of the first embodiment.
Figure 12:
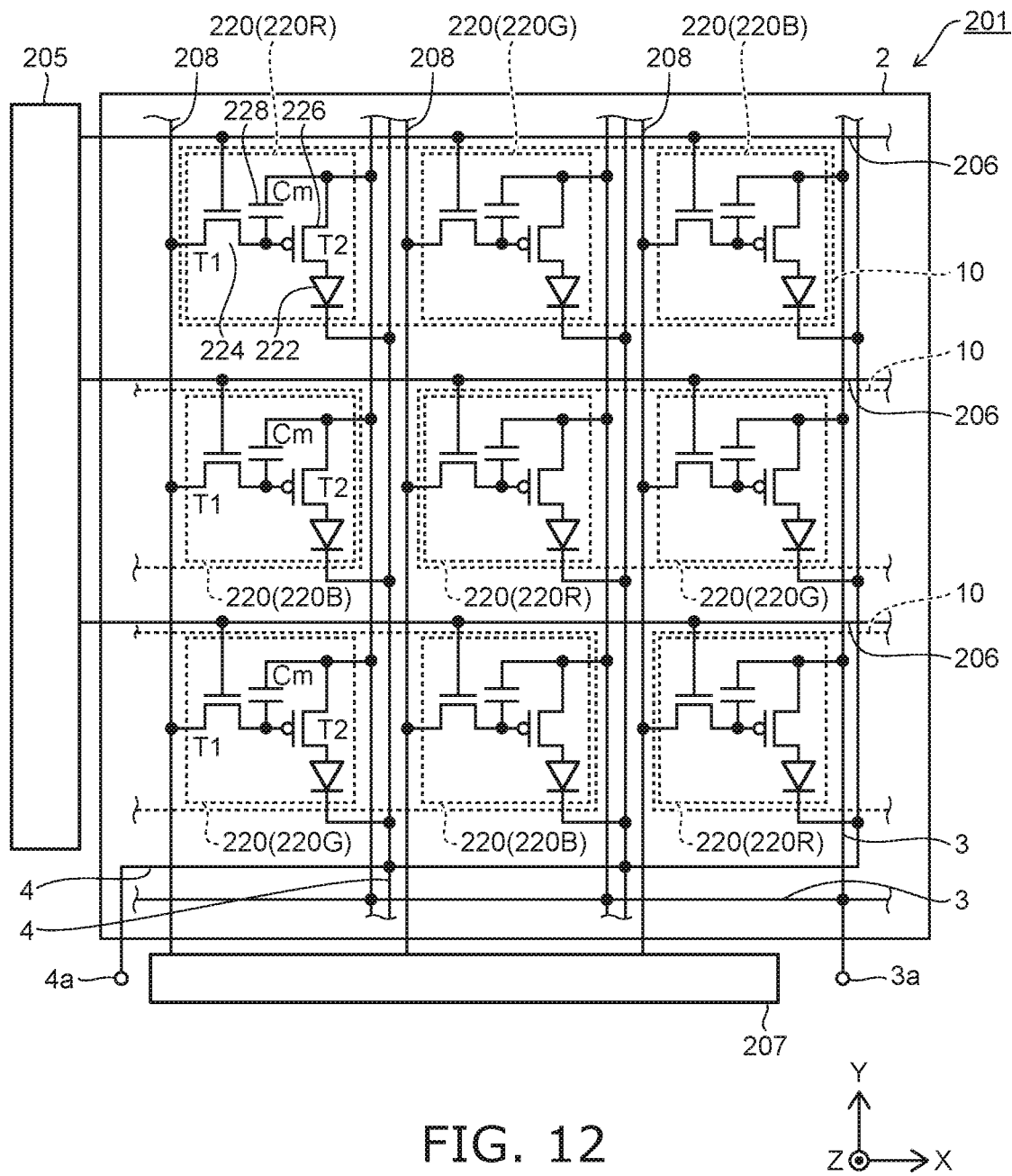
FIG. 12 is a schematic block diagram illustrating the image display device of the second embodiment.

The transistor 103 is formed on the substrate 102. As shown in FIG. 3 and FIG. 12 to be described later, in addition to the transistor 103, circuit elements such as other transistors, resistors, and capacitors are formed on the substrate 102, and the circuit 101 is formed by interconnects and the like. Hereinafter, the circuit 101 includes an element formation region 104 in which circuit elements are formed, an insulating layer 105, the interconnect layer 110, vias that connect the interconnect layer 110 and the circuit elements, and an insulating film 108 that insulates between the circuit elements. Other components such as the substrate 102, the circuit 101, and the interlayer insulating film 112 may be referred to as a circuit board 100.

The transistor 103 includes a p-type semiconductor region 104b, n-type semiconductor regions 104s and 104d, and a gate 107. The gate 107 is provided on the p-type semiconductor region 104b with the insulating layer 105 interposed therebetween. The insulating layer 105 is provided to insulate the element formation region 104 from the gate 107 and sufficiently insulate from other adjacent circuit elements. When a voltage is applied to the gate 107, a channel can be formed in the p-type semiconductor region 104b. The transistor 103 is an n-channel MOSFET.

The element formation region 104 is provided in the substrate 102. The substrate 102 is, for example, a Si substrate. The element formation region 104 includes a p-type semiconductor region 104b and n-type semiconductor regions 104s and 104d. The p-type semiconductor region 104b is provided near the surface of the substrate 102. The n-type semiconductor regions 104s and 104d are provided spaced from each other in the vicinity of the surface of the p-type semiconductor region 104b in the p-type semiconductor region 104b.

The insulating layer 105 is provided on the surface of the substrate 102. The insulating layer 105 also covers the element formation region 104 and covers the surfaces of the p-type semiconductor region 104b and the n-type semiconductor regions 104s and 104d. The insulating layer 105 is made of, for example, $SiO_2$. The insulating layer 105 may be a multi-layered insulating layer including $SiO_2$, $Si_3N_4$ or the like depending on the covered region. The insulating layer 105 may include a layer of an insulating material having a high dielectric constant.

The gate 107 is provided on the p-type semiconductor region 104b with the insulating layer 105 interposed therebetween. The gate 107 is provided between the n-type semiconductor regions 104s and 104d. The gate 107 is made of, for example, polycrystalline Si. The gate 107 may include silicide having a lower resistance than polycrystalline Si.

In this example, the gate 107 and the insulating layer 105 are covered with the insulating film 108. The insulating film 108 is made of, for example, $SiO_2$ or $Si_3N_4$. In order to flatten the surface for forming the interconnect layer 110, an organic insulating film such as PSG (Phosphorus Silicon Glass) or BPSG (Boron Phosphorus Silicon Glass) may be further provided.

Vias 111s and 111d are formed in the insulating film 108. The first interconnect layer (first interconnect layer) 110 is formed on the insulating film 108. The first interconnect layer 110 includes multiple interconnects having different potentials, and includes interconnects 110s and 110d. In this way, in each of the cross sectional views of FIG. 1 and subsequent figures, the symbol of the interconnect layer is displayed at a position next to one interconnect included in the interconnect layer. The vias 111s and 111d are provided between the interconnects 110s and 110d of the interconnect layer 110 and the n-type semiconductor regions 104s and 104d, respectively, and electrically connect them. The interconnect layer 110 and the vias 111s and 111d are formed of a metal such as Al or Cu, for example. The interconnect layer 110 and the vias 111s and 111d may include a refractory metal or the like.

The first interlayer insulating film 112 is further provided as a planarized film on the insulating film 108 and the interconnect layer 110. The interlayer insulating film (first insulating film) 112 is an organic insulating film such as PSG or BPSG. The first interlayer insulating film 112 also functions as a protective film that protects the surface of the circuit board 100.

A buffer layer 140 is provided over the interlayer insulating film 112. The buffer layer (buffer layer) 140 includes a nitride such as AlN. By providing the buffer layer 140, it can be expected that crystal defects generated when the light emitting element 150 is epitaxially grown are reduced. As described above, the light emitting element 150 may be provided directly on the first interlayer insulating film 112, not only when the buffer layer 140 is provided between the light emitting element 150 and the first interlayer insulating film 112.

Figure 4:
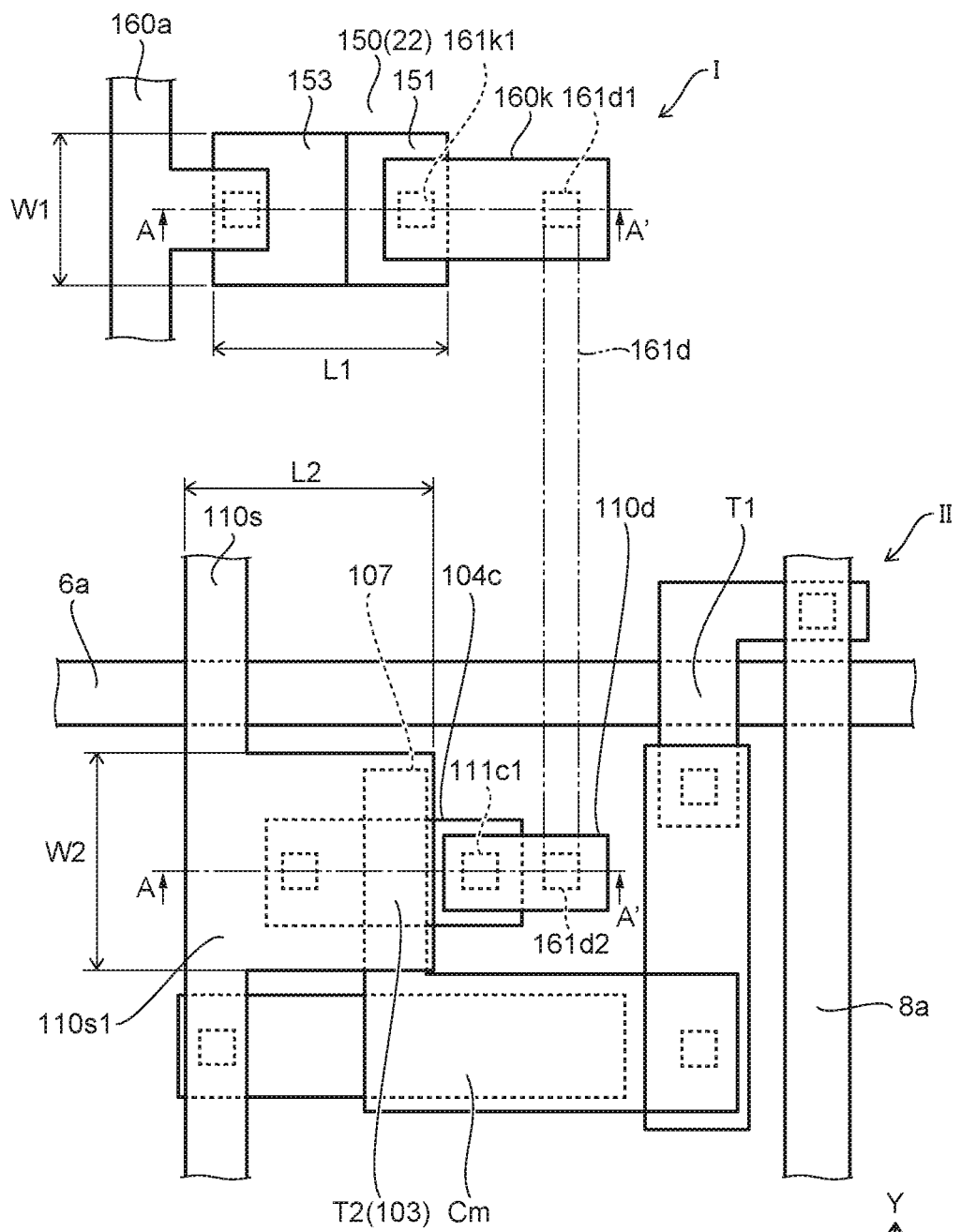
FIG. 4 is a schematic plan view illustrating a portion of the image display device of the first embodiment.

The interconnect (first conductor) 110s in the circuit board 100 is provided so as to extend in the X-axis direction to the position where the light emitting element 150 is placed. As shown in FIG. 4 to be described later, the interconnect 110s extends in the Y-axis direction about the length of the light emitting element in the Y-axis direction or longer than that.

In other words, the outer periphery of the interconnect 110s includes the outer periphery of the light emitting element 150 when the light emitting element 150 is projected from above the Z axis in the XY plan view. Accordingly, the interconnect 110s can block light from being scattered below the light emitting element 150 so that the interconnect 110s does not reach the transistor 103. By appropriately selecting the material of the interconnect 110s, the downward scattering of the light emitting element 150 can be reflected to the light emitting surface 153S side, and the light emission efficiency can be improved. In addition, because the interconnect 110s blocks scattered light from below the light emitting element 150, arrival of light to the transistor 103 is suppressed, and malfunction of the transistor 103 can be prevented.

The light emitting element 150 includes an n-type semiconductor layer (first semiconductor layer) 151, a light emitting layer 152, and a p-type semiconductor layer (second semiconductor layer) 153. The n-type semiconductor layer 151, the light emitting layer 152, and the p-type semiconductor layer 153 are stacked in this order from the interlayer insulating film 112 of the circuit board 100 toward the positive direction of the Z-axis, that is, toward the light emitting surface 153S. The light emitting element 150 has, for example, a substantially square or rectangular shape in the XY plan view, but the corners may be rounded. The light emitting element 150 may have, for example, an elliptical shape or a circular shape in the XY plan view. By appropriately selecting the shape and arrangement of the light emitting elements in the plan view, the degree of freedom in layout is improved. In this example, the n-type semiconductor layer 151 has a stepped portion 151a extending on the buffer layer 140 in the X-axis direction.

For the light emitting element 150, for example, a nitride semiconductor such as $In_XAl_YGa_{1-X-Y}N$ (0≤X, 0≤Y, X+Y<1) and the like is preferably used. The light emitting element 150 is a so-called blue light emitting diode, and the wavelength of light emitted from the light emitting element 150 is, for example, about 467 nm±20 nm. The wavelength of the light emitted from the light emitting element 150 may be blue-violet light emission of about 410 nm±20 nm. The wavelength of light emitted from the light emitting element 150 is not limited to the above value, and may be appropriate.

The second interlayer insulating film (second insulating film) 156 covers the buffer layer 140 and the light emitting element 150. The second interlayer insulating film 156 is made of a transparent resin. The interlayer insulating film 156 has a function of protecting the light emitting element 150 and planarizing a surface for the interconnect layer 160 formed over the second interlayer insulating film 156.

A via (second via) 161k is provided to extend through the second interlayer insulating film 156. A first end of the via 161k is connected to the stepped portion 151a.

The via (first via) 161d is provided to extend through the interlayer insulating films 112 and 156. A first of the via 161d is connected to the interconnect 110d.

The interconnect layer 160 is provided on the planarized interlayer insulating film 156. The interconnect layer 160 includes interconnects 160a and 160k. The interconnect 160a is connected to the p-type semiconductor layer 153 through a contact hole opened in the interlayer insulating film 156. Although not shown in the drawing, the interconnect 160a is connected to a power supply line that supplies power to the subpixel 20.

The interconnect 160k is connected to second ends of the vias 161k and 161d. Therefore, the n-type semiconductor layer 151 of the light emitting element 150 is electrically connected to the main electrode of the transistor 103 through the vias 161k and 161d and the interconnects 160k and 110d.

The surface resin layer 170 covers the second interlayer insulating film 156 and the second interconnect layer 160. The surface resin layer 170 is made of a transparent resin, and protects the interlayer insulating film 156 and the interconnect layer 160 and provides a planarized surface for bonding the color filter 180.

The color filter 180 includes a light block portion 181 and a color conversion portion 182. The color conversion portion 182 is provided immediately above the light emitting surface 153S of the light emitting element 150 according to the shape of the light emitting surface 153S. In the color filter 180, the portion other than the color conversion portion 182 is a light block portion 181. The light block portion 181 is a so-called black matrix, which reduces blurring due to color mixing of light emitted from the adjacent color conversion portion 182 and makes it possible to display a sharp image.

The color conversion portion 182 has one layer or two layers. FIG. 1 shows a two-layer color conversion portion 182. Whether it is one layer or two layers is determined by the color of light emitted from the subpixel 20, that is, the wavelength. In the case in which the emission colors of the subpixels 20 are red or green, the color conversion portion 182 preferably has two layers. When the emission color of the subpixel 20 is blue, it is preferably a single layer.

When the color conversion portion 182 has two layers, the first layer closer to the light emitting element 150 is a color conversion layer 183 and the second layer is a filter layer 184. That is, the filter layer 184 is stacked on the color conversion layer 183.

The color conversion layer 183 is a layer that converts the wavelength of light emitted from the light emitting element 150 to a desired wavelength. In the case of the subpixel 20 that emits red light, light having a wavelength of 467 nm±20 nm, which is the wavelength of the light emitting element 150, is converted to light having a wavelength of about 630 nm±20 nm, for example. In the case of the subpixel 20 that emits green light, light having a wavelength of 467 nm±20 nm, which is the wavelength of the light emitting element 150, is converted to light having a wavelength of about 532 nm±20 nm, for example.

The filter layer 184 blocks the wavelength component of blue light emission remaining without being color-converted by the color conversion layer 183.

When the color of light emitted from the subpixel 20 is blue, the subpixel 20 may output the light through the color conversion layer 183 or may output the light as it is without the color conversion layer 183. When the wavelength of light emitted from the light emitting element 150 is about 467 nm±20 nm, the subpixel 20 may output the light without passing through the color conversion layer 183. In the case in which the wavelength of light emitted from the light emitting element 150 is set to 410 nm±20 nm, it is preferable to provide one color conversion layer 183 in order to convert the wavelength of output light to about 467 nm±20 nm.

Even in the case of the blue subpixel 20, the subpixel 20 may have the filter layer 184. By providing the filter layer 184 on the blue subpixel 20, minute external light reflection generated on the surface of the light emitting element 150 is suppressed.

(Modification)

A modification of the subpixel configuration will be described.

Figure 2A:
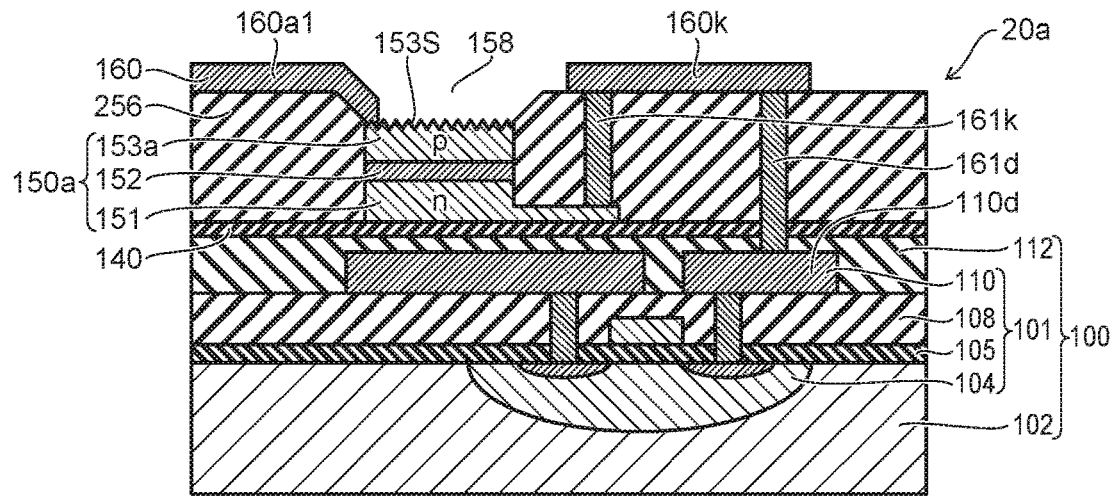
FIG. 2A to FIG. 2C are schematic cross sectional views illustrating one of modifications of the image display device of the first embodiment.
Figure 2B:
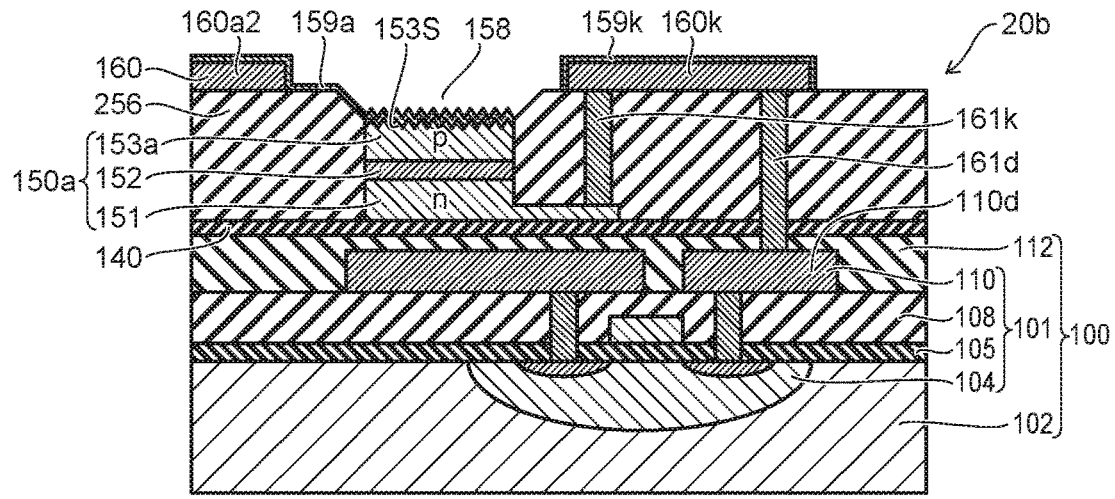
Figure 2C:
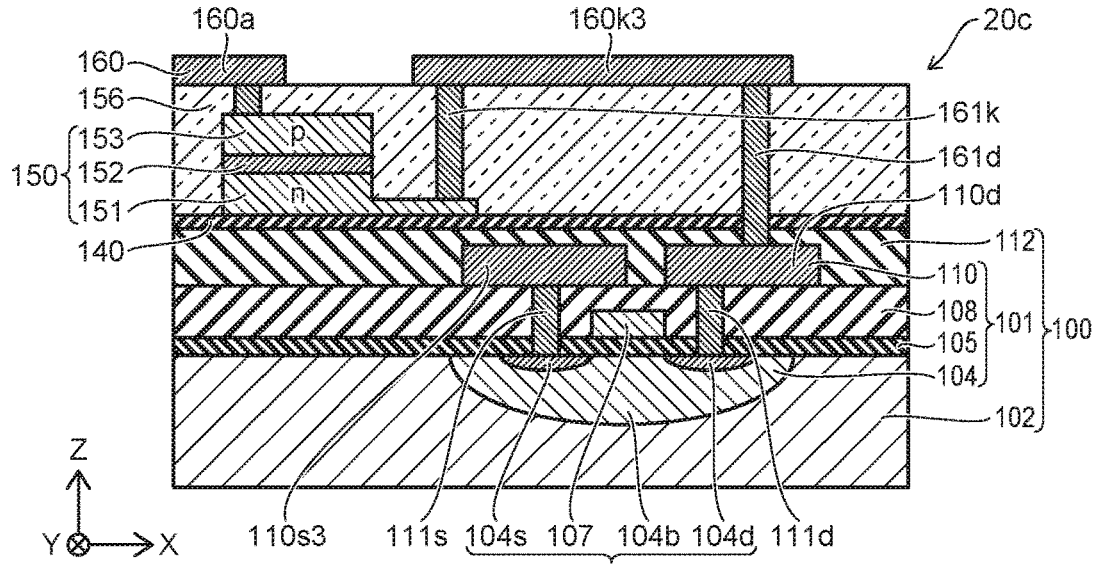

FIG. 2A to FIG. 2C are schematic cross sectional views illustrating modifications of the image display device according to the present embodiment.

In the cross-sectional views of the subpixels after FIG. 2A, the display of the surface resin layer 170 and the color filter 180 is omitted to avoid complexity. Unless otherwise specified, a surface resin layer and a color filter are provided on the second interlayer insulating film and the second interconnect layer. The same applies to other embodiments described later and modifications thereof.

In the case of FIG. 2A and FIG. 2B, the subpixels 20a and 20b are different in the configuration of a light emitting element 150a from that in the first embodiment. Other components are the same as those in the above-described first embodiment, and detailed descriptions thereof will be omitted as appropriate.

As shown in FIG. 2A, the subpixel 20a includes the light emitting element 150a. The light emitting element 150a is covered with a second interlayer insulating film (second insulating film) 256. The second interlayer insulating film 256 is made of preferably a white resin. When the interlayer insulating film 256 is made of the white resin, light emitted from the light emitting element 150a in the lateral direction or the downward direction can be reflected, and the luminance of the light emitting element 150a can be substantially improved.

The second interlayer insulating film 256 may be made of a black resin. By using the black resin for the interlayer insulating film 256, light scattering in the subpixel is suppressed, and stray light is more effectively suppressed. The image display device in which stray light is suppressed can display a sharper image.

The second interlayer insulating film 256 has an opening 158. The opening 158 is formed by removing a part of the interlayer insulating film 256 above the light emitting element 150a. The interconnect 160a1 is connected to the p-type semiconductor layer 153a exposed through the opening 158.

The p-type semiconductor layer 153a has a light emitting surface 153S exposed through the opening 158. The light emitting surface 153S is a surface facing a surface in contact with the light emitting layer 152 among the surfaces of the p-type semiconductor layer 153a. The light emitting surface 153S is preferably roughened. The light emitting element 150a can improve the light extraction efficiency when the light emitting surface 153S is a rough surface.

As shown in FIG. 2B, in the subpixel 20b, transparent electrodes 159a and 159k are provided on interconnects 160a2 and 160k, respectively. The transparent electrode 159a is provided on the light emitting surface 153S of the opened p-type semiconductor layer 153a, and electrically connects the interconnect 160a2 and the p-type semiconductor layer 153a.

By providing the transparent electrode 159a on the light emitting surface 153S, the connection area with the p-type semiconductor layer 153a can be increased, and the light emission efficiency can be improved. When the light emitting surface 153S is a rough surface, the connection area between the light emitting surface 153S and the transparent electrode 159a can be increased, and the contact resistance can be reduced.

FIG. 2C shows a case in which the positions of the circuit element such as the transistor 103 and the light emitting element 150 are shifted from each other on the XY plane.

For the following reasons, the light emitting element 150 and the transistor 130 may be arranged so as not to overlap in a plan view. A depletion layer region is generated between the p-type semiconductor region 104b and the n-type substrate 102, and this depletion layer region may function as a parasitic photodiode. It is preferable that the parasitic photodiode does not overlap a light irradiated region generated immediately below the light emitting element 150. In that case, it is preferable that the distance between the end when the light emitting layer 152 is projected on the surface of the substrate 102 in the XY plan view and the boundary of the p-type semiconductor region 104b is separated by at least about 1 µm or more.

As shown in FIG. 2C, in the subpixel 20c, an interconnect 110s3 does not extend to the position where the light emitting element 150 is placed. That is, the interconnect 110s3 does not necessarily include the outer peripheral portion of the light emitting element 150 when projected from above the Z-axis in the XY plan view. On the other hand, the interconnect 160k3 extends longer in the X-axis direction than in the case of the above-described embodiment and other modifications.

As described above, when the light emitting element 150 is arranged sufficiently away from the circuit element, scattered light traveling in the negative direction of the Z-axis is reduced, so that malfunction of the circuit element such as the transistor 103 due to light becomes less likely to occur. When it is not necessary to block light by the interconnect in the circuit board 100, because the interconnect is not used for light block, the degree of freedom in circuit arrangement is improved and the integration density can be improved.

The present embodiment can include any of the configurations of the subpixels 20 to 20c described above.

FIG. 3 is a schematic block diagram illustrating the image display device according to the present embodiment.

As shown in FIG. 3, the image display device 1 of the present embodiment includes a display area 2. Subpixels 20 are arranged in the display area 2. The subpixels 20 are arranged in a lattice pattern, for example. For example, n subpixels 20 are arranged along the X-axis, and m subpixels 20 are arranged along the Y-axis.

The pixel 10 includes multiple subpixels 20 that emit light of different colors. The subpixel 20R emits red light. The subpixel 20G emits green light. The subpixel 20B emits blue light. The three types of subpixels 20R, 20G, and 20B emit light with desired luminance, whereby the emission color and luminance of one pixel 10 are determined.

One pixel 10 includes three subpixels 20R, 20G, and 20B, and the subpixels 20R, 20G, and 20B are linearly arranged on the X-axis as in this example, for example. In each pixel 10, subpixels of the same color may be arranged in the same column, or subpixels of different colors may be arranged in the same column as in this example.

The image display device 1 further includes a power line 3 and a ground line 4. The power supply line 3 and the ground line 4 are laid out in a lattice pattern along the arrangement of the subpixels 20. The power supply line 3 and the ground line 4 are electrically connected to each subpixel 20, and supply power to each subpixel 20 from a DC power supply connected between the power supply terminal 3a and the GND terminal 4a. The power supply terminal 3a and the GND terminal 4a are provided at the ends of the power supply line 3 and the ground line 4, respectively, and are connected to a DC power supply circuit provided outside the display area 2. The power supply terminal 3a is supplied with a positive voltage with respect to the GND terminal 4a.

The image display device 1 further includes a scanning line 6 and a signal line 8. The scanning line 6 is laid out in a direction parallel to the X-axis. In other words, the scanning line 6 is laid out along the array of the subpixels 20 in the row direction. The signal line 8 is laid out in a direction parallel to the Y-axis. That is, the signal line 8 is laid out along the column-direction arrangement of the subpixels 20.

The image display device 1 further includes a row selection circuit 5 and a signal voltage output circuit 7. The row selection circuit 5 and the signal voltage output circuit 7 are provided along the outer edge of the display area 2. The row selection circuit 5 is provided along the Y-axis direction of the outer edge of the display area 2. The row selection circuit 5 is electrically connected to the subpixels 20 in each column via the scanning line 6 and supplies a selection signal to each subpixel 20.

The signal voltage output circuit 7 is provided along the outer edge of the display area 2. The signal voltage output circuit 7 is provided along the X-axis direction of the outer edge of the display area 2. The signal voltage output circuit 7 is electrically connected to the subpixels 20 in each row via the signal line 8 and supplies a signal voltage to each subpixel 20.

The subpixel 20 includes a light emitting element 22, a selection transistor 24, a drive transistor 26, and a capacitor 28. In FIG. 3, the select transistor 24 may be displayed as T1, the drive transistor 26 may be displayed as T2, and the capacitor 28 may be displayed as Cm.

The light emitting element 22 is connected in series with the drive transistor 26. In the present embodiment, the drive transistor 26 is an n-channel MOSFET, and a cathode electrode that is an n-electrode of the light-emitting element 22 is connected to a drain electrode that is a main electrode of the drive transistor 26. A series circuit of the light emitting element 22 and the driving transistor 26 is connected between the power supply line 3 and the ground line 4. The drive transistor 26 corresponds to the transistor 103 in FIG. 1 and the like, and the light emitting element 22 corresponds to the light emitting element 150 in FIG. 1 and the like. The current flowing through the light emitting element 22 is determined by the voltage applied between the gate and the source of the drive transistor 26, and the light emitting element 22 emits light with luminance corresponding to the flowing current through the light emitting element 22.

The selection transistor 24 is connected between the gate electrode of the drive transistor 26 and the signal line 8 via the main electrode. The gate electrode of the selection transistor 24 is connected to the scanning line 6. The capacitor 28 is connected between the gate electrode of the drive transistor 26 and the ground line 4.

The row selection circuit 5 selects one row from the array of m subpixels 20 and supplies a selection signal to the scanning line 6. The signal voltage output circuit 7 supplies a signal voltage having a necessary analog voltage value to each subpixel 20 in the selected row. The signal voltage is applied between the gate and source of the drive transistor 26 of the subpixel 20 in the selected row. The signal voltage is held by the capacitor 28. The drive transistor 26 causes a current corresponding to the signal voltage to flow through the light emitting element 22. The light emitting element 22 emits light with luminance according to the flowing current.

The row selection circuit 5 supplies a selection signal by sequentially switching the rows to be selected. That is, the row selection circuit 5 scans the row in which the subpixels 20 are arranged. A current corresponding to the signal voltage flows through the light emitting elements 22 of the subpixels 20 that are sequentially scanned to emit light. Each pixel 10 emits light with the light emission color and luminance determined by the light emission color and luminance emitted by the RGB subpixels 20 and an image is displayed in the display area 2.

FIG. 4 is a schematic plan view illustrating a portion of the image display apparatus of the present embodiment.

In the present embodiment, as described in FIG. 1, the light emitting element 22 (150) and the drive transistor 26 (103) are stacked in the Z-axis direction, and the cathode electrode of the light emitting element 22 (150) and the drain electrode of the drive transistor 26 (103) are electrically connected by the via 161d.

A plan view of the layer I is schematically displayed in the upper part of FIG. 4, and a plan view of the layer II is schematically displayed in the lower part. In FIG. 4, the layer I is denoted as "I" and the second layer is denoted as "II". The layer I is a layer in which the light emitting element 22 (150) is formed. That is, in FIG. 1, the layer I includes layers from the buffer layer 140 to the second interconnect layer 160 in the positive direction of the Z-axis. In FIG. 4, the buffer layer 140 and the second interlayer insulating film 156 are not shown. In FIG. 1, the layer II includes layers from the substrate 102 to the first interlayer insulating film 112 in the positive direction of the Z-axis. In FIG. 4, the substrate 102, the insulating layer 105, the insulating film 108, and the first interlayer insulating film 112 are not shown. In this figure, a channel region 104c is shown as the element formation region 104.

The cross section in FIG. 1 is an arrow cross sectional view taken along the line AA' at the portion indicated by the dash-dot line in each of the layer I and the layer II.

As shown in FIG. 4, the interconnect 160k is connected to the n-type semiconductor layer 151 serving as a cathode electrode of the light emitting element 150 through the via 161k (FIG. 1) and its contact hole 161k1. The interconnect 160k is connected to a first end of the via 161d through a contact hole 161d1 provided in the second interlayer insulating film 156. The via 161d is schematically indicated by a two-dot chain line in the drawing.

A second end of the via 161d is connected to the interconnect 110d through a contact hole 161d2 provided in the first interlayer insulating film 112. The interconnect 110d is connected to the via 111d (FIG. 1) through the contact hole 111c1 opened in the insulating film 108 and is connected to the drain electrode of the transistor 103. In this manner, the light emitting element 150 and the transistor 103 formed in the layer I and the layer II, respectively, which are different layers, can be electrically connected by the via 161d extending through the interlayer insulating films 156 and 112.

An arrangement in which the light emission of the light emitting element 150 is blocked by the interconnect 110s will be described with reference to FIG. 4.

The interconnect 110s has a light block portion 110s1. The light block portion (portion) 110s1 is a rectangular portion having a length L2 in the X-axis direction and a length W2 in the Y-axis direction. The light block portion 110s1 is provided directly below the light emitting element 150. The light emitting element 150 has a rectangular bottom surface having a length L1 in the X-axis direction and a length W1 in the Y-axis direction.

The length of each portion is set to satisfy L2>L1 and W2>W1. Because the light block portion 110s1 is provided immediately below the light emitting element 150, the outer periphery of the light block portion 110s1 includes the outer periphery of the light emitting element 150. The outer periphery of the light block portion 110s1 only needs to include the outer periphery of the light emitting element 150, and the shape of the light block portion 110s1 is not limited to a square, and can be any appropriate shape.

The light emitting element 150 emits light upward, and there exist downward light, reflected light or scattered light or the like at the interface between the interlayer insulating film 112 and the surface resin layer 170. Therefore, preferably, the outer periphery of the light block portion 110s1 is set to include the outer periphery of the light emitting element 150 projected onto the light block portion 110s1 in the XY plan view. By setting the light block portion 110s1 in this way, it is possible to suppress the arrival of light below the light emitting element 150 and reduce the influence of light on the circuit element.

A method for manufacturing the image display device 1 of the present embodiment will be described.

FIG. 5A to FIG. 6C are schematic cross sectional views illustrating the method for manufacturing the image display device of the present embodiment.

Figure 5A:
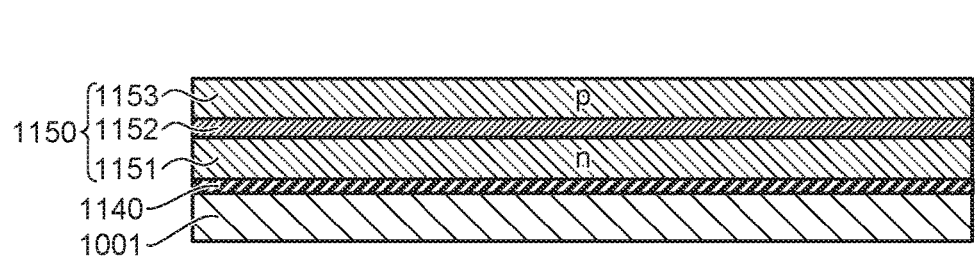
FIG. 5A to FIG. 5C are schematic cross sectional views illustrating a method for manufacturing the image display device of the first embodiment.

As shown in FIG. 5A, a semiconductor growth substrate 1194 is prepared. The semiconductor growth substrate 1194 has a semiconductor layer 1150 grown on a crystal growth substrate (first substrate) 1001. The crystal growth substrate 1001 is, for example, a Si substrate or a sapphire substrate. Preferably, a Si substrate is used.

In this example, a buffer layer 1140 is formed on one surface of the crystal growth substrate 1001. For the buffer layer (buffer layer) 1140, a nitride such as AlN is preferably used. The buffer layer 1140 is used to alleviate mismatch at the interface between the GaN crystal and the crystal growth substrate 1001 when GaN is epitaxially grown.

In the semiconductor growth substrate 1194, an n-type semiconductor layer 1151, a light emitting layer 1152, and a p-type semiconductor layer are stacked on the buffer layer 1140 in this order from the buffer layer 1140 side. For the growth of the semiconductor layer 1150, for example, a vapor deposition method (Chemical Vapor Deposition, CVD method) is used, and a metal organic chemical vapor deposition method (MOCVD method) is suitably used. The semiconductor layer 1150 is, for example, $In_XAl_YGa_{1-X-Y}N$ ($0 \leq X$, $0 \leq Y$, $X+Y<1$) or the like.

Figure 5B:
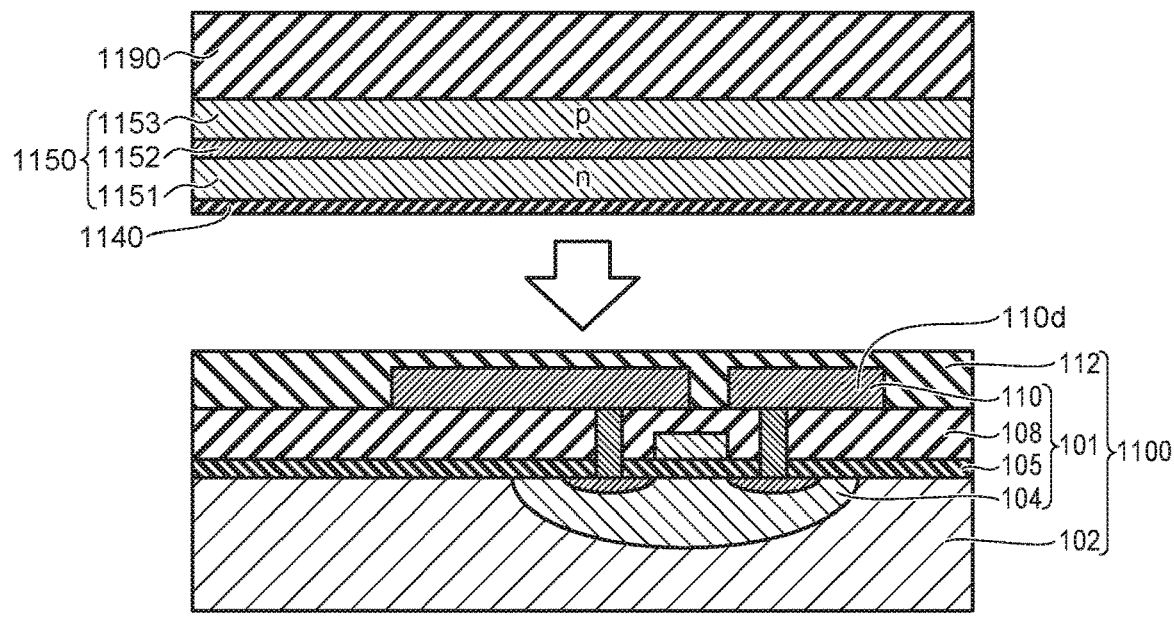

As shown in FIG. 5B, after the semiconductor layer 1150 is formed, a support substrate 1190 is bonded to the open surface of a p-type semiconductor layer 1153 on the side opposite to the side on which the crystal growth substrate 1001 is provided. The support substrate 1190 is made of, for example, Si or quartz. Thereafter, the crystal growth substrate 1001 is removed. For example, a laser is used to remove the crystal growth substrate 1001.

A circuit board 1100 is prepared. The circuit board (second substrate) 1100 includes the circuit 101 described with reference to FIG. 1 or the like.

As indicated by the arrows in the figure, one surface of the circuit board 1100 and the surface of the buffer layer 1140 of the semiconductor layer 1150 are aligned and bonded together. The bonding surface of the circuit board 1100 is an exposed surface of the interlayer insulating film 112 formed on the interconnect layer 110.

In wafer bonding in which two substrates are bonded together, for example, the two substrates are heated and bonded together by thermocompression bonding. In the thermocompression bonding, a low-melting point metal or a low-melting point alloy may be used. The low-melting point metal is, for example, Sn or In, and the low-melting point alloy can be, for example, an alloy mainly composed of Zn, In, Ga, Sn, Bi, or the like.

In wafer bonding, in addition to the above, the bonding surfaces of the respective substrates are flattened using chemical mechanical polishing (CMP), etc., and then the bonding surfaces may be cleaned and adhered in a vacuum by plasma treatment.

Figure 5C:
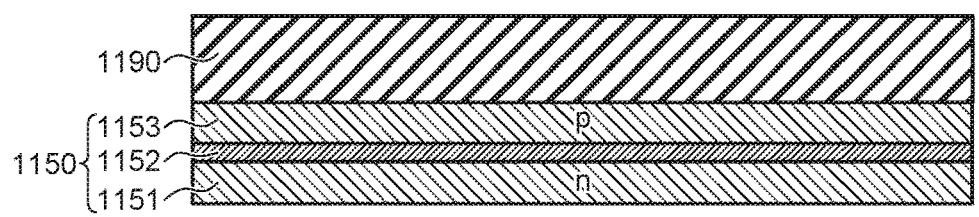

As shown in FIG. 5C, in the wafer bonding, the semiconductor layer 1150 may be attached to the supporting substrate 1190 and the crystal growth substrate 1001 may be removed, and then the buffer layer 1140 may be removed. The semiconductor layer 1150 supported by the support substrate 1190 is bonded to the circuit board 1100 with the surface of the n-type semiconductor layer 1151 opened after the buffer layer 1140 is removed. Alternatively, a semiconductor growth substrate in which the semiconductor layer 1150 is crystal-grown without providing the buffer layer 1140 may be used. Hereinafter, a case in which wafer bonding is performed in a state where the buffer layer 1140 is provided will be described. However, even when the buffer layer 1140 is omitted, the same manufacturing can be performed.

Figure 6A:
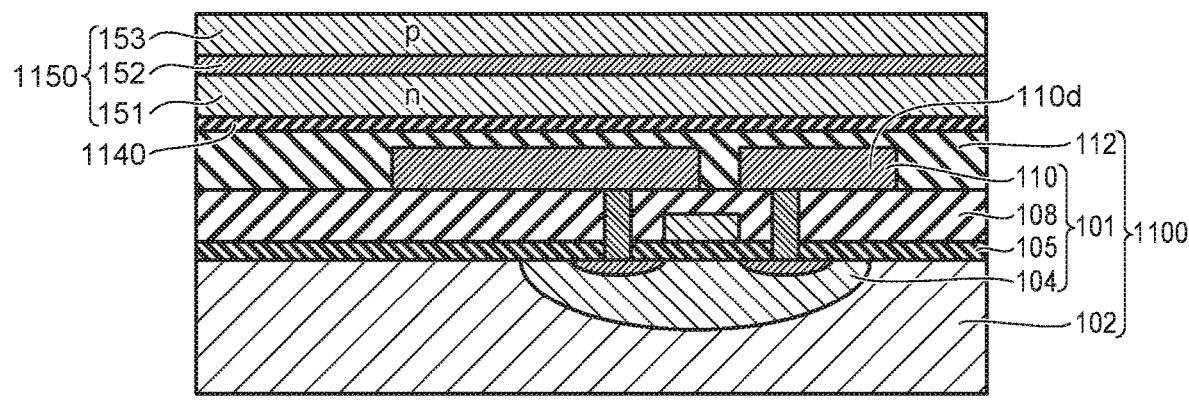
FIG. 6A to FIG. 6C are schematic cross sectional views illustrating a method for manufacturing the image display device of the first embodiment.
Figure 6B:
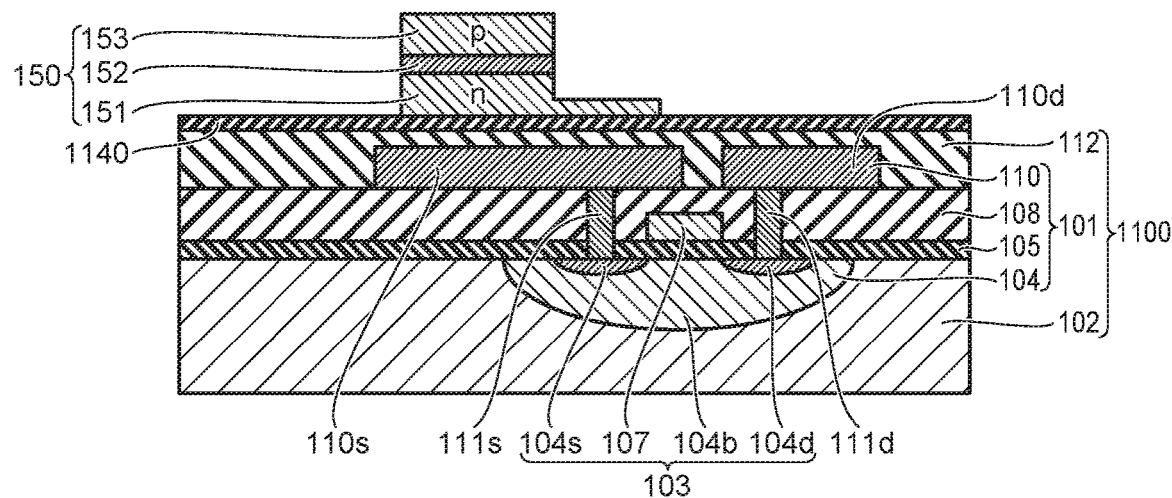

As shown in FIG. 6A and FIG. 6B, the circuit board 1100 is bonded to the semiconductor layer 1150 through the buffer layer 1140 by wafer bonding. The semiconductor layer 1150 is formed into the shape of the light emitting element 150. For forming the light emitting element 150, for example, a dry etching process is used, and preferably, anisotropic plasma etching (Reactive Ion Etching, RIE) is used.

Figure 6C:
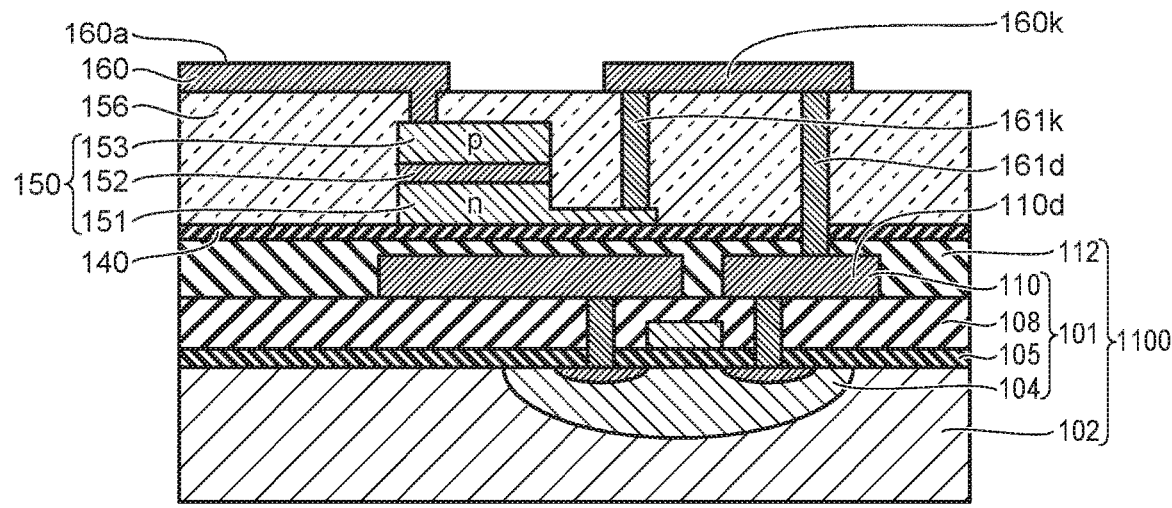

As shown in FIG. 6C, the interlayer insulating film 156 is formed to cover the light emitting element 150. A via hole is formed in the interlayer insulating film 156. Thereafter, the via hole is filled with a conductive metal material. Either wet etching or dry etching can be used to form the via hole.

Thereafter, a conductive layer is formed in the via hole by sputtering or the like, and the interconnect layer 160 is formed by photolithography. After forming the via hole, the via and the interconnect layer may be formed at the same time.

A portion of the circuit other than the subpixel 20 is formed in the circuit board 100. For example, the row selection circuit 5 (FIG. 3) can be formed in the circuit board 100 together with a drive transistor, a selection transistor, and the like. That is, the row selection circuit 5 may be incorporated at the same time by the above manufacturing process. On the other hand, the signal voltage output circuit 7 is mounted on another substrate together with the CPU and other circuit elements. For example, the signal voltage output circuit 7 is mutually connected to the interconnect of the circuit board 100 before or after the incorporation of the color filter described later.

Preferably, the circuit board 1100 is a wafer including the circuit 101. The circuit board 1100 is formed with the circuit 101 for one or multiple image display devices. Alternatively, in the case of a larger screen size or the like, the circuit 101 for constituting one image display device is divided into multiple circuit boards 1100, and all the divided circuits are combined and one image display device may be configured.

Preferably, the crystal growth substrate 1001 is a wafer having the same size as the wafer-like circuit board 1100.

Alternatively, the semiconductor layer 1150 formed on the multiple crystal growth substrates 1001 may be bonded to one circuit board 1100.

Figure 7A:
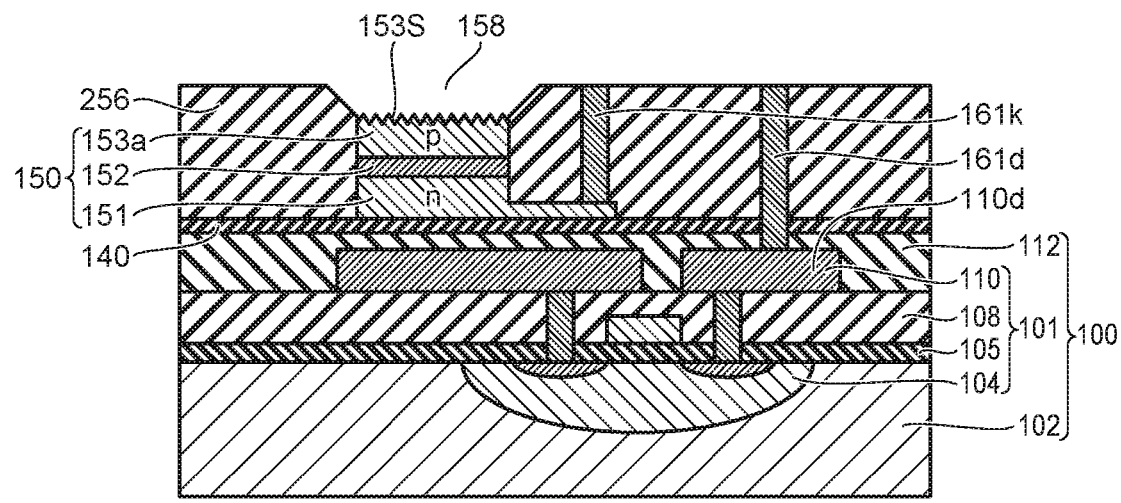
FIG. 7A and FIG. 7B are schematic cross sectional views illustrating a method for manufacturing a modification of the image display device of the first embodiment.
Figure 7B:
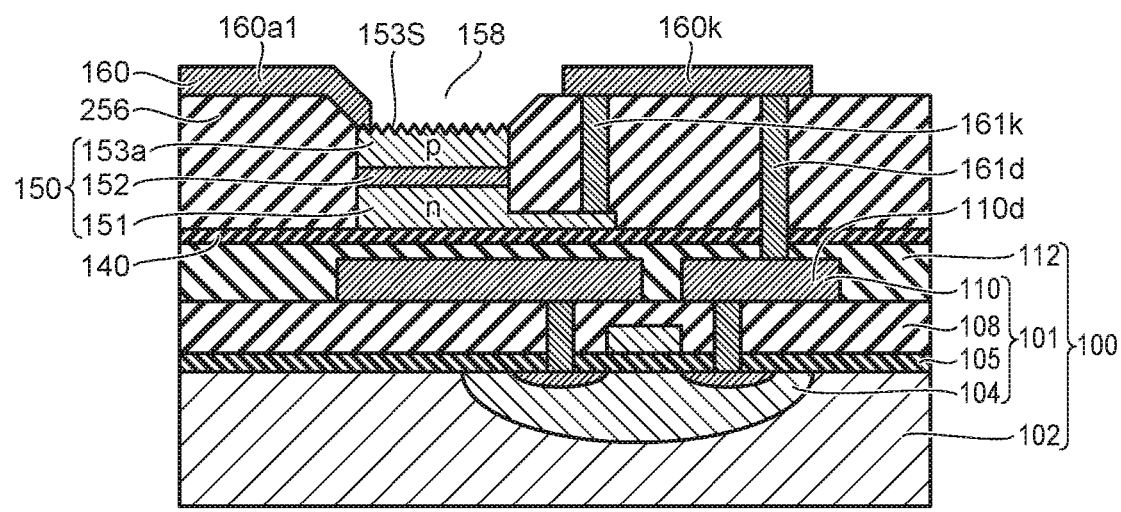

FIG. 7A and FIG. 7B are schematic cross sectional views illustrating a method for manufacturing a modification of the image display device according to the present embodiment.

FIG. 7A and FIG. 7B show a manufacturing process for forming the subpixel 20a of FIG. 2A. In the modification, the same steps as those in the first embodiment are performed until the second interlayer insulating film 256 (156) is formed. In the following description, it is assumed that the process of FIG. 7A and FIG. 7B is performed after the process of FIG. 6B or FIG. 6C.

As shown in FIG. 7A, an opening 158 is formed by etching the second interlayer insulating film 256 (156), and the surface of the p-type semiconductor layer 153 is exposed. Etching may be wet etching or dry etching.

Thereafter, the light emitting surface 153S of the exposed p-type semiconductor layer 153 is roughened to improve the light emission efficiency.

As shown in FIG. 7B, the interconnect layer is formed with including the opening 158, and the interconnects 160a1 and 160k are formed by photolithography. The interconnect 160a1 is formed so as to be connected to the light emitting surface 153S of the exposed p-type semiconductor layer 153.

In this way, the modified subpixel 20a is formed.

Figure 8A:
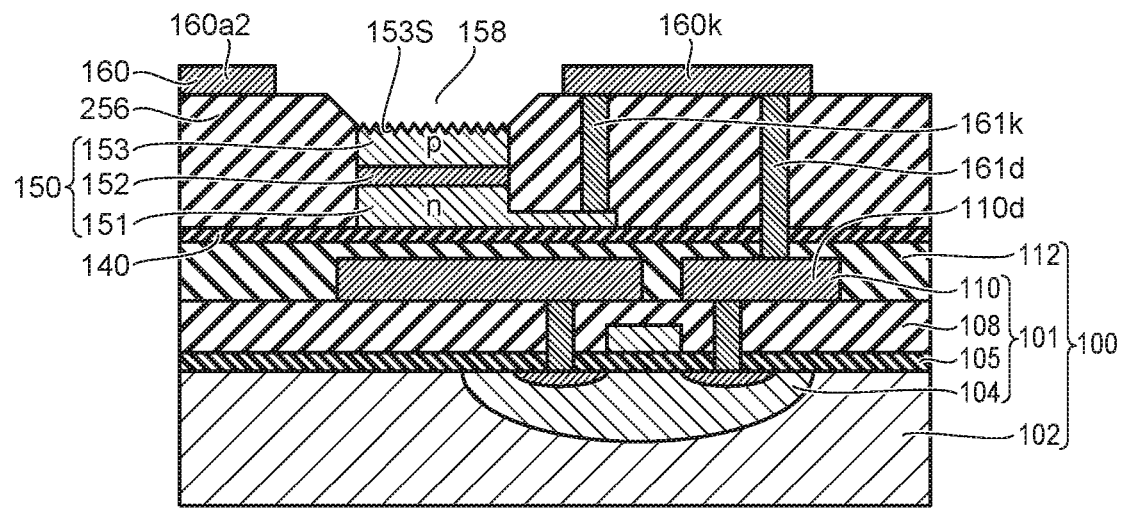
FIG. 8A and FIG. 8B are schematic cross sectional views illustrating a method for manufacturing one of modifications of the image display device of the first embodiment.
Figure 8B:
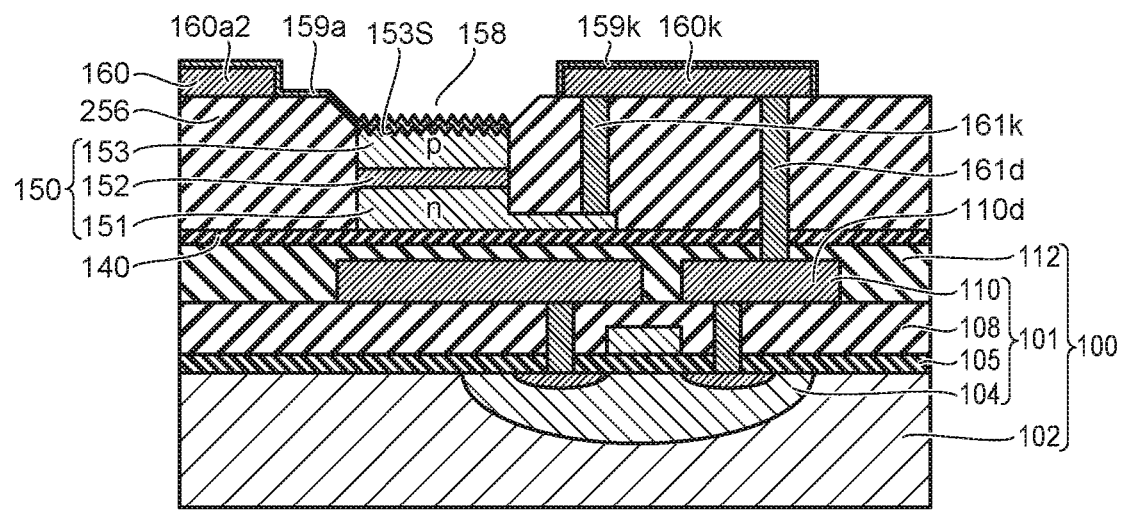

FIG. 8A and FIG. 8B are schematic cross sectional views illustrating ae manufacturing method of one modification of the image display device of the present embodiment.

FIG. 8A and FIG. 8B show a manufacturing process for forming the subpixel 20b shown in FIG. 2B. In the modification, the same processes as those in the above-described modification are performed until the opening 158 is formed. Therefore, the following description will be made assuming that the processes of FIG. 8A and FIG. 8B are executed after FIG. 7A.

As shown in FIG. 8A, after forming the opening 158 so as to expose the light emitting surface 153S of the p-type semiconductor layer 153, the interconnects 160a2 and 160k are formed. The interconnect 160a2 is not connected to the light emitting surface 153S of the p-type semiconductor layer 153.

As shown in FIG. 8B, a transparent conductive film is formed to cover the interconnect layer 160, the second interlayer insulating film 256 (156), and the light emitting surface 153S of the p-type semiconductor layer 153. As the transparent conductive film, an ITO film, a ZnO film, or the like is preferably used. Necessary transparent electrodes 159a and 159k are formed by photolithography. The transparent electrode 159a is formed on the interconnect 160a2 and also on the light emitting surface 153S of the p-type semiconductor layer 153. Therefore, the interconnect 160a2 and the p-type semiconductor layer 153 are electrically connected. Preferably, the transparent electrode 159a is provided so as to cover the entire surface of the exposed light emitting surface 153S, and is connected to the light emitting surface 153S.

In this way, the subpixel 20b of the modification is formed.

Figure 9:
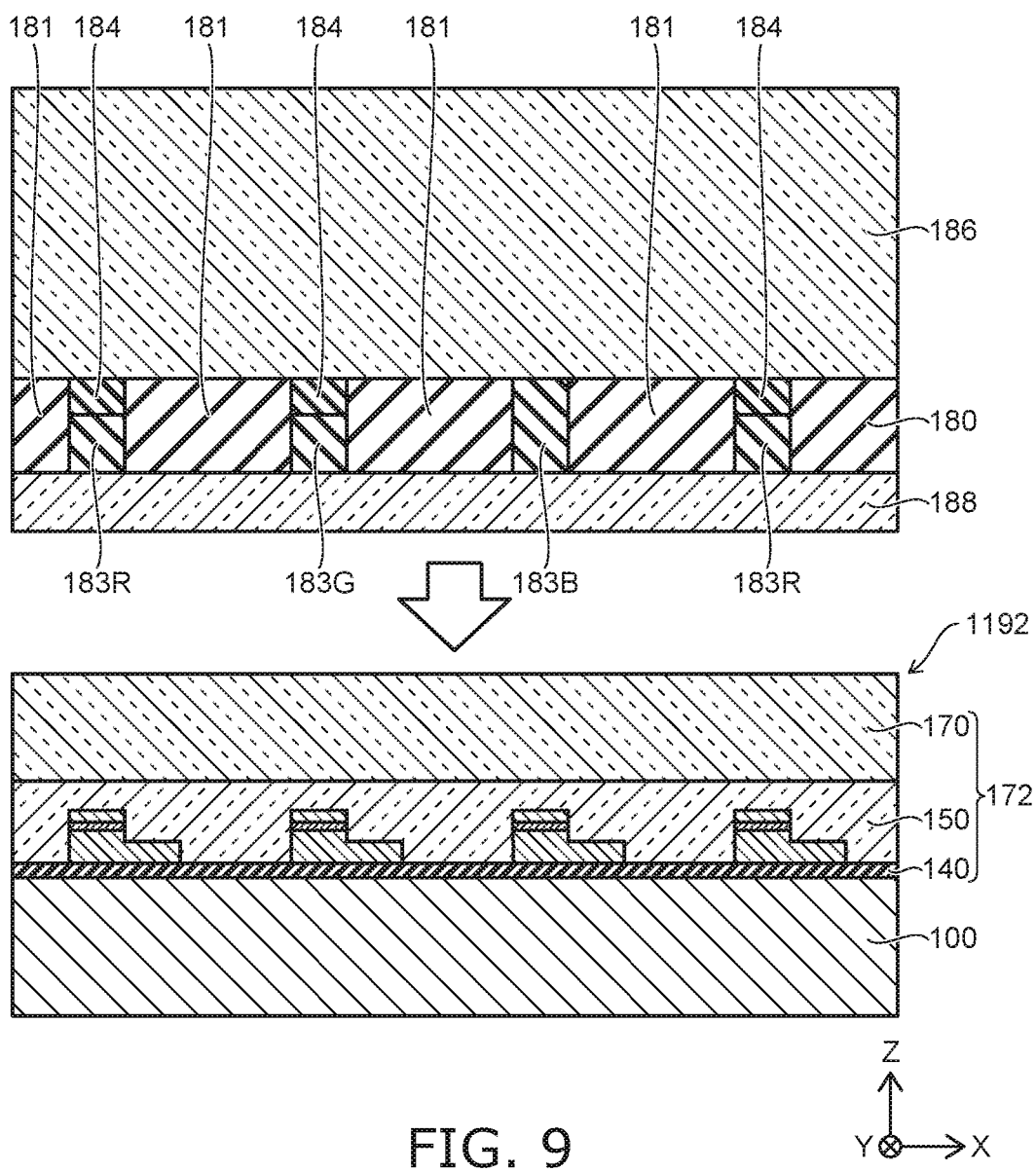
FIG. 9 is a schematic cross sectional view illustrating a method for manufacturing the image display device of the first embodiment.

FIG. 9 is a schematic cross sectional view illustrating the method for manufacturing the image display device of the present embodiment.

In FIG. 9, in order to avoid complication, the display of the interconnect in the circuit board 100 and the interlayer insulating films 112 and 156 is omitted. In FIG. 9, a portion of the color conversion member such as the color filter 180 is displayed. Here, a structure including the buffer layer 140, the light emitting element 150, the vias 161k and 161d, the interconnect layer 160, the interlayer insulating film 156, and the surface resin layer 170 is referred to as a light emitting circuit portion 172. A structure in which the light emitting circuit portion 172 is provided over the circuit board 100 is referred to as a structure body 1192.

As shown in FIG. 9, a first surface of the color filter 180 is adhered to the structure body 1192. A second surface of the color filter 180 is adhered to a glass substrate 186. A transparent thin film adhesive layer 188 is provided on a first surface of the color filter 180, and the color filter 180 is adhered to the surface of the structure body 1192 on the light emitting circuit portion 172 side through the transparent thin film adhesive layer 188.

In this example, the color filter 180 includes color conversion portion arranged in the positive direction of the X-axis in the order of red, green, and blue. For red and green, a red color conversion layer 183R and a green color conversion layer 183G are provided in the first layer, and a filter layer 184 is provided in the second layer. For blue, a color conversion layer 183B of a monolayer is provided. A light block portion 181 is provided between the color conversion portions.

The color filter 180 is attached to the structure body 1192 so that the color conversion layers 183R, 183G, and 183B of the respective colors are aligned with the position of the light emitting element 150.

FIG. 10A to FIG. 10D are schematic cross sectional views showing a modification of the manufacturing method of the modification of the image display device of the present embodiment.

FIG. 10A to FIG. 10D show a method for forming a color filter by ink jetting.

Figure 10A:
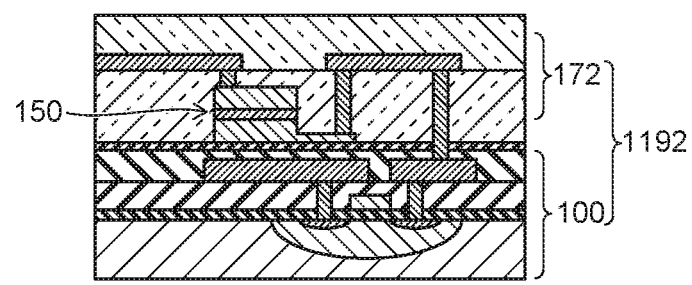
FIG. 10A to FIG. 10D are schematic cross sectional views illustrating a method for manufacturing a modification of the image display device of the first embodiment.

As shown in FIG. 10A, a structure body 1192 in which a light emitting circuit portion 172 is attached to a circuit board 100 is prepared.

Figure 10B:
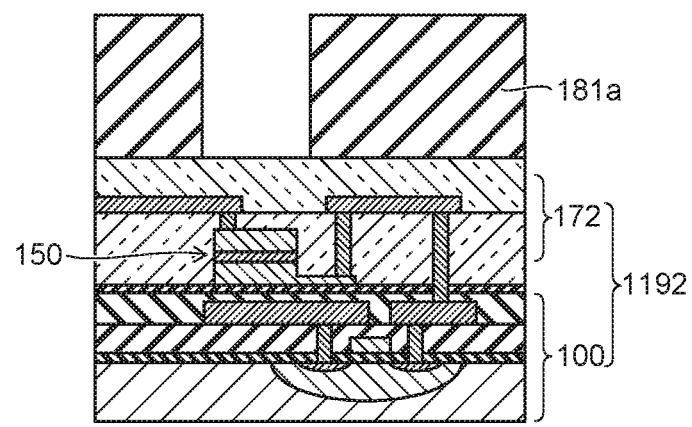

As shown in FIG. 10B, a light block portion 181a is formed over the structure body 1192. The light block portion 181a is formed by using, for example, screen printing or photolithography technology.

Figure 10C:
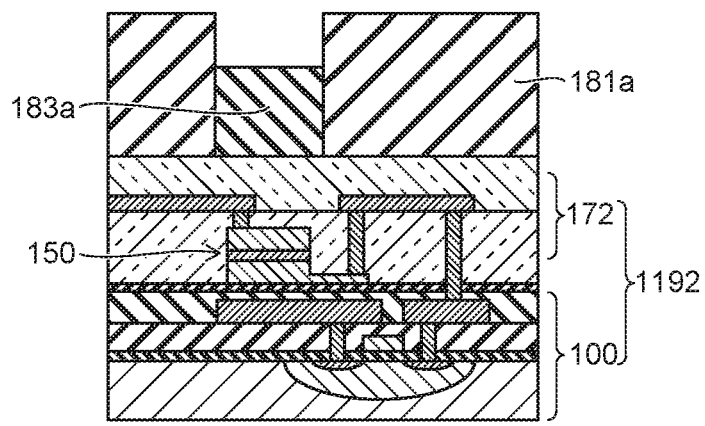

As shown in FIG. 10C, the phosphor 183a corresponding to the emission color is ejected from the inkjet nozzle. The phosphor 183a colors a region where the light block portion 181a is not formed. As the phosphor 183a, for example, a fluorescent paint using a general phosphor material or a quantum dot phosphor material is used. The use of a quantum dot phosphor material is preferable because each emission color can be realized, monochromaticity is high, and color reproducibility can be enhanced. After drawing with an inkjet nozzle, a drying process is performed at an appropriate temperature and time. The thickness of the coating film at the time of coloring is set to be thinner than the thickness of the light block portion 181a.

As already described, because the color conversion portion may not be formed for the blue light emitting subpixel, the phosphor is not ejected. Further, in the case of forming a blue color conversion layer for the blue light emitting subpixel, the color conversion portion may be a single layer. Therefore, preferably, the thickness of the coating film of the blue phosphor is set to the same level as thickness of the light block portion 181a.

Figure 10D:
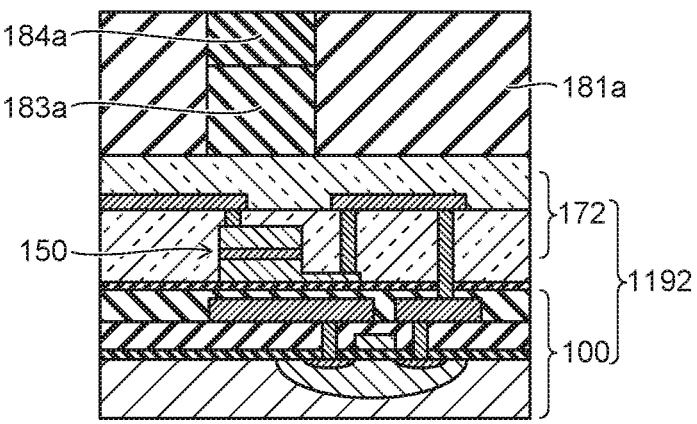

As shown in FIG. 10D, the paint 184a for the filter layer is ejected from the inkjet nozzle. The paint 184a is applied to overlap the coating film of the phosphor 183a. The total thickness of the coating film of the phosphor 183a and the paint 184a is set to the same level as the thickness of the light block portion 181a.

In this way, the image display device 1 can be manufactured.

The effect of the image display device 1 of this embodiment is demonstrated.

In the method for manufacturing the image display device 1 according to the present embodiment, the semiconductor layer 1150 including the light emitting layer 1152 for the light emitting element 150 is bonded together the circuit board 1100 (100) including the circuit elements such as the transistor 103 that drives the light emitting element 150. After that, the light emitting element 150 is formed by etching the semiconductor layer 1150. Therefore, the process of transferring the light emitting elements can be significantly shortened as compared with the case of individually transferring the individualized light emitting elements on the circuit board 1100 (100).

For example, in a 4K image display device, the number of subpixels exceeds 24 million, and in the case of an 8K image display device, the number of subpixels exceeds 99 million. Mounting such a large number of light emitting elements individually on the circuit board requires an enormous amount of time, and it is difficult to realize an image display device using micro LEDs at a realistic cost. Further, if a large number of light emitting elements are individually mounted, the yield due to poor connection at the time of mounting or the like is lowered, and further cost increase is inevitable.

On the other hand, in the method for manufacturing the image display device 1 of the present embodiment, the entire semiconductor layer 1150 is attached to the circuit board 1100 (100) before the semiconductor layer 1150 is separated into individual pieces, so that the transfer process is completed once.

After the light emitting element is directly formed on the circuit board by etching or the like, the light emitting element and the circuit element in the circuit board 1100 (100) are electrically connected by forming a via, so that a uniform connection structure is realized. And a decrease in yield can be suppressed.

Furthermore, because the semiconductor layer 1150 is attached to the circuit board 1100 (100) at a wafer level without individualizing the semiconductor layer 1150 in advance or forming electrodes at positions corresponding to the circuit elements, alignment is not necessary. Therefore, it is possible to easily perform the attaching process in a short time. Because it is not necessary to align at the time of attachment, the light emitting element 150 can be easily downsized and is suitable for a high-definition display.

Second Embodiment

Figure 11:
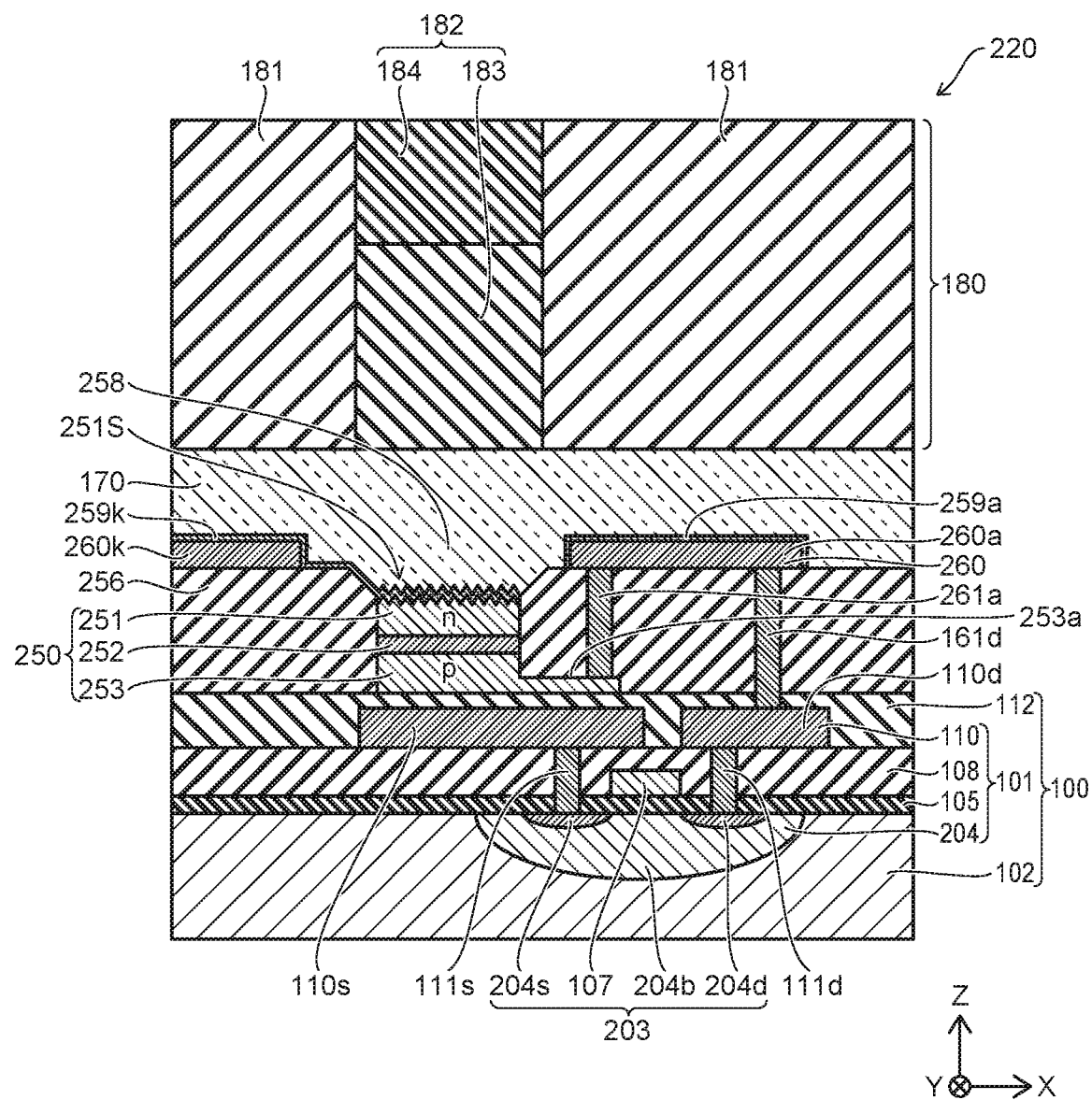
FIG. 11 is a schematic cross sectional view illustrating a portion of an image display device according to a second embodiment.

FIG. 11 is a schematic cross-sectional view illustrating a portion of the image display device according to the present embodiment.

In the present embodiment, the configuration of a light emitting element 250 and the configuration of a transistor 203 that drives the light emitting element 250 are different from those in the other embodiments described above. The same components as those in the other embodiments described above are denoted by the same reference numerals, and detailed descriptions thereof is omitted as appropriate.

As shown in FIG. 11, a subpixel 220 of the image display device according to the present embodiment includes a transistor 203 and a light emitting element 250. The transistor 203 is formed in an element formation region 204 formed in the substrate 102. The element formation region 204 includes an n-type semiconductor region 204b and p-type semiconductor regions 204s and 204d. The n-type semiconductor region 204b is provided near the surface of the substrate 102. The p-type semiconductor regions 204s and 204d are provided in the n-type semiconductor region 204b near the surface of the n-type semiconductor region 204b so as to be separated from each other.

A gate 107 is provided on the n-type semiconductor region 204b with the insulating layer 105 interposed therebetween. The gate 107 is provided between the p-type semiconductor regions 204s and 204d.

The structure of the upper portion of the transistor 203 and the structure of the interconnect are the same as those in the other embodiments described above. In the present embodiment, the transistor 203 is a p-channel MOSFET.

The light emitting element 250 includes a p-type semiconductor layer (first semiconductor layer) 253, a light emitting layer 252, and an n-type semiconductor layer (second semiconductor layer) 251. The p-type semiconductor layer 253, the light emitting layer 252 and the n-type semiconductor layer 251 are stacked in this order from the first interlayer insulating film 112 of the circuit board 100 toward a light emitting surface 251S. The light emitting element 250 has, for example, a substantially square or rectangular shape in the XY plan view, but the corners may be rounded. The light emitting element 250 may have, for example, an elliptical shape or a circular shape in the XY plan view. By appropriately selecting the shape and arrangement of the light emitting elements in the plan view, the degree of freedom in layout is improved. In this example, the p-type semiconductor layer 253 has a stepped portion 253a extending on the first interlayer insulating film 112 in the X-axis direction.

The light emitting element 250 may be made of the same material as in the other embodiments described above. The light emitting element 250 emits, for example, blue light having a wavelength of about 467 nm±20 nm or blue-violet light having a wavelength of 410 nm±20 nm.

In the present embodiment, the light emitting element 250 is provided on the interlayer insulating film (first insulating film) 112 without using a buffer layer.

The second interlayer insulating film (second insulating film) 256 covers the first interlayer insulating film 112 and the light emitting element 250. The second interlayer insulating film 256 has an opening 258. The opening 258 is formed on the light emitting element 250, and the interlayer insulating film 256 is not provided on the light emitting surface 251S of the light emitting element 250. The interlayer insulating film 256 is preferably made of a white resin so that the light emitted from the light emitting element 250 is reflected and is effectively output from the opening 258.

The light emitting surface 251S is a surface facing the surface in contact with the light emitting layer 252 among the surfaces of the n-type semiconductor layer 251. The light emitting surface 251S is roughened.

A via (second via) 261a is provided through the interlayer insulating film 256. A first end of the via 261a is connected to the stepped portion 253a.

The via (first via) 161d is provided through the interlayer insulating films 112 and 256. A first end of the via 161d is connected to the interconnect 110d.

An interconnect layer 260 is provided on the interlayer insulating film 256. The interconnect layer 260 includes interconnects 260k and 260a. The interconnect 260a is connected to second ends of the vias 261a and 161d. Therefore, the p-type semiconductor layer 253 of the light emitting element 250 is electrically connected to the main electrode of the transistor 203 through the vias 261a and 161d.

Although not shown, the interconnect 260k is connected to a ground line. A transparent electrode 259k is provided on the interconnect 260k. The transparent electrode 259k extends to the light emitting surface 251S and is provided over the entire surface of the light emitting surface 251S. Therefore, the n-type semiconductor layer 251 is connected to the ground line via the transparent electrode 259k and the interconnect 260k.

A transparent electrode 259a is also disposed on the interconnect 260a.

A surface resin layer 170 is provided on the interlayer insulating film 256 and the transparent electrodes 259k and 259a.

FIG. 12 is a schematic block diagram illustrating the image display device according to the present embodiment.

As shown in FIG. 12, the image display device 201 of the present embodiment includes the display area 2, a row selection circuit 205, and a signal voltage output circuit 207.

In the display area 2, for example, the subpixels 220 are arranged in a lattice pattern as in the case of the other embodiments described above.

In the present embodiment, a light emitting element 222 is provided on the ground line 4 side, and a drive transistor 226 connected in series to the light emitting element 222 is provided on the power supply line 3 side. That is, the drive transistor 226 is connected to a higher potential side than the light emitting element 222. The drive transistor 226 is a p-channel MOSFET.

A selection transistor 224 is connected between the gate electrode of the drive transistor 226 and a signal line 208. A capacitor 228 is connected between the gate electrode of the drive transistor 226 and the power supply line 3.

The row selection circuit 205 and the signal voltage output circuit 207 supply a selection signal and a signal voltage having different polarities from those of the other embodiments described above to a scanning line 206 and the signal line 208 in order to drive the drive transistor 226 which is the p-channel MOSFET.

In the present embodiment, because the polarity of the drive transistor 226 is a p-channel, the polarity of the selection signal and the signal voltage is different from those in the other embodiments described above. That is, the row selection circuit 205 supplies a selection signal to the scanning line 206 so as to sequentially select one row from the arrangement of the m rows of subpixels 220. The signal voltage output circuit 207 supplies a signal voltage having a necessary analog voltage value to each subpixel 220 in the selected row. The drive transistor 226 of the subpixel 220 in the selected row passes a current corresponding to the signal voltage to the light emitting element 222. The light emitting element 222 emits light with luminance according to the flowing current.

A method for manufacturing the image display device 201 of the present embodiment will be described.

Figure 13A:
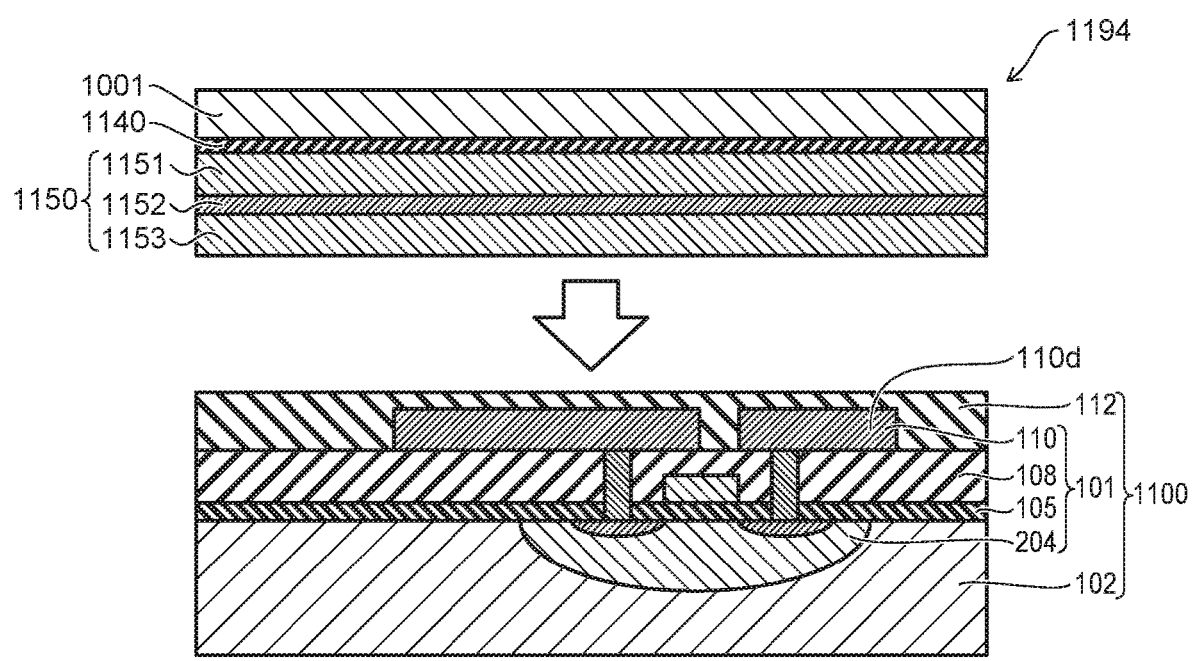
FIG. 13A and FIG. 13B are schematic cross sectional views illustrating a method for manufacturing the image display device of the second embodiment.
Figure 13B:
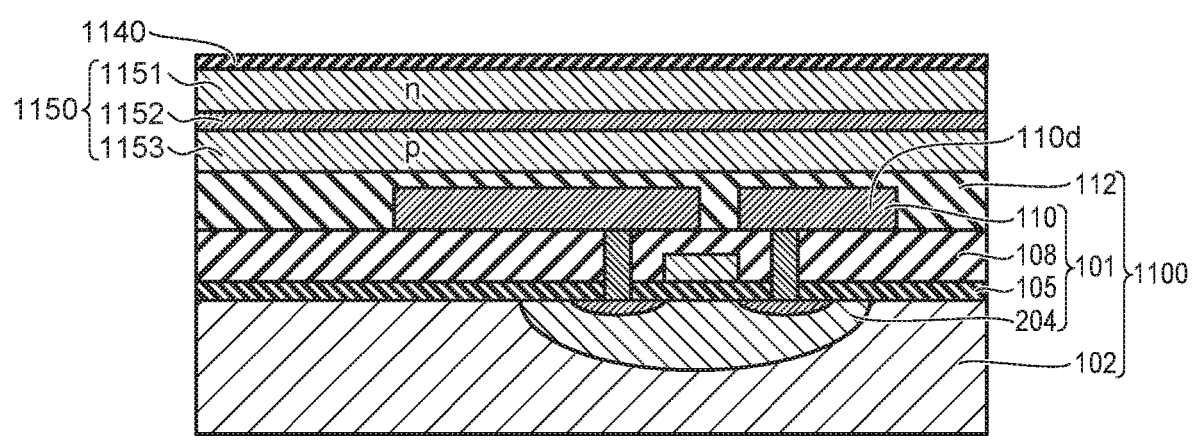

FIG. 13A and FIG. 13B are schematic cross-sectional views illustrating the method for manufacturing the image display device according to the present embodiment.

In the present embodiment, the semiconductor growth substrate 1194 already described with reference to FIG. 5A is used. Hereinafter, processes after the semiconductor growth substrate 1194 having the semiconductor layer 1150 epitaxially grown on the crystal growth substrate 1001 via the buffer layer 1140 is prepared will be described.

As shown in FIG. 13A, in the present embodiment, without removing the crystal growth substrate 1001 from the semiconductor growth substrate 1194, the semiconductor growth substrate 1194 is turned upside down and attached to the circuit board 1100. That is, the exposed surface of the p-type semiconductor layer 1153 opposite to the crystal growth substrate 1001 is attached to the planarized surface of the interlayer insulating film 112 of the circuit board 1100 by wafer bonding, as indicated by the arrows in the figure. Wafer bonding can be performed in the same manner as in the other embodiments described above.

As shown in FIG. 13B, the crystal growth substrate 1001 is removed by laser irradiation or the like.

Figure 14A:
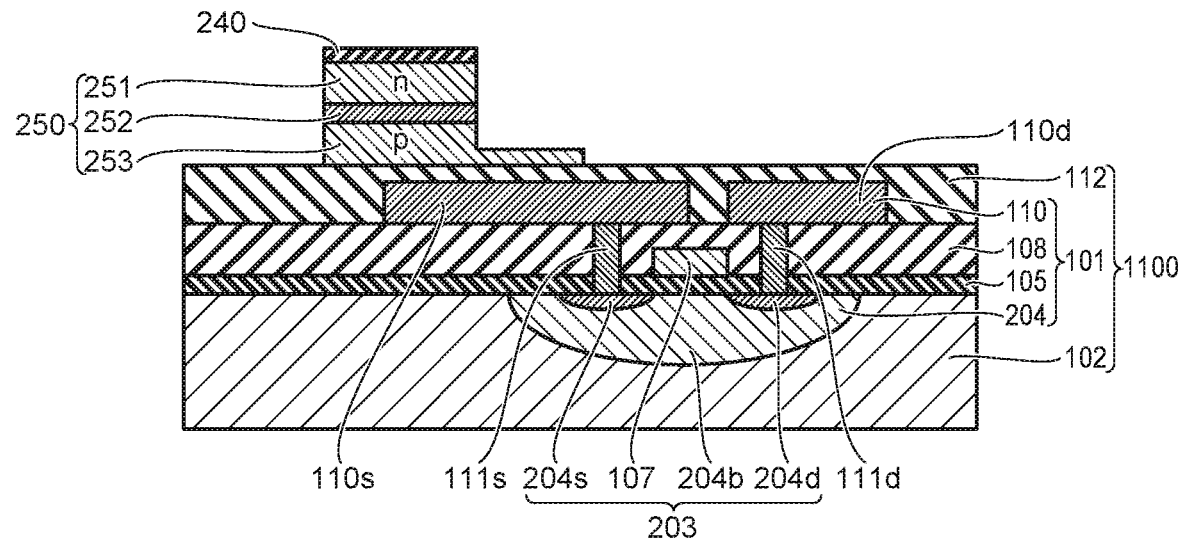
FIG. 14A and FIG. 14B are schematic cross sectional views illustrating a method for manufacturing the image display device of the second embodiment.

As shown in FIG. 14A, the semiconductor layer 1150 is etched together with the buffer layer 1140 to form the light emitting element 250. Because a buffer layer 240 remains on the light emitting element 250, the buffer layer 240 is removed by further etching. The buffer layer 240 may be removed before the light emitting element 250 is formed.

Figure 14B:
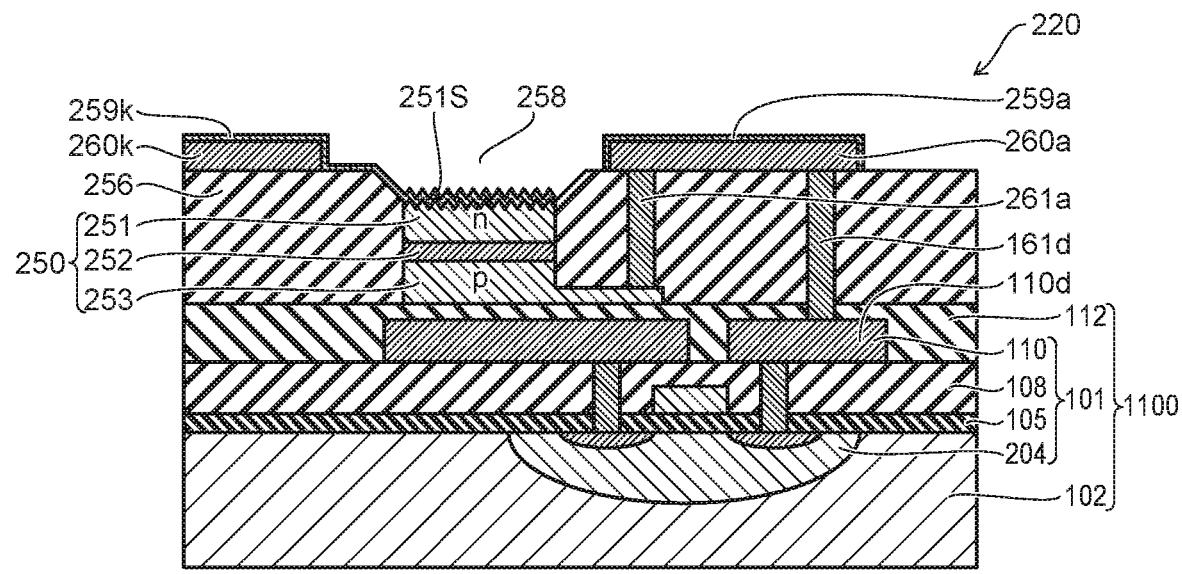

As shown in FIG. 14B, the second interlayer insulating film 256 that covers the first interlayer insulating film 112 and the light emitting element 250 is formed. Thereafter, a via hole is formed so as to extend through the second interlayer insulating film 256. A conductive metal material is filled in the via hole.

The opening 258 is formed in the second interlayer insulating film 256, and the light emitting surface 251S of the n-type semiconductor layer 251 is exposed. The opening 258 is formed by either a wet or dry etching method.

Thereafter, the light emitting surface 251S of the exposed n-type semiconductor layer 251 is roughened to improve the light emission efficiency.

A interconnect layer is formed with including the opening 258, and the interconnects 260k and 260a are formed by photolithography. The interconnect 260a is connected to the vias 261a and 161d. The interconnect 260k is connected to a ground line (not shown).

Thereafter, transparent electrodes 259a and 259k are provided on the interconnects 260a and 260k, respectively. The transparent electrode 259k is provided extending to the light emitting surface 251S. The transparent electrode 259k is provided over the entire surface of the light emitting surface 251S. Therefore, the n-type semiconductor layer 251 is connected to the ground line 4 via the transparent electrode 259k and the interconnect 260k.

Figure 15:
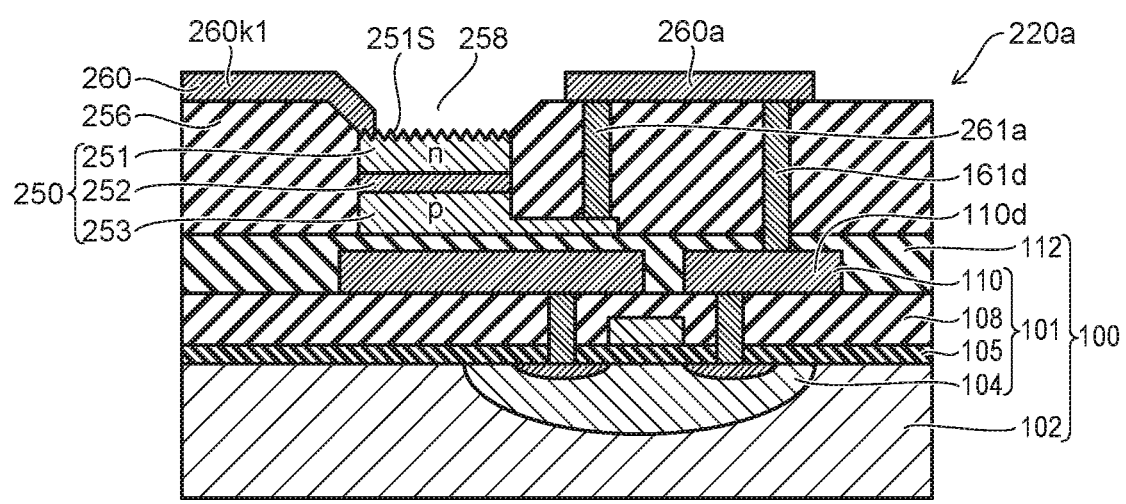
FIG. 15 is a schematic cross sectional view illustrating a portion of a modification of the image display device of the second embodiment.

FIG. 15 is a schematic cross-sectional view illustrating a portion of a modification of the image display device according to the modification of the present embodiment.

As shown in FIG. 15, in the modification, the interconnect and the light emitting surface are electrically connected without using the transparent electrode. In a subpixel 220a, an interconnect 260k1 is patterned so as to be directly connected to the n-type semiconductor layer 251 without passing through the transparent electrode.

In the present embodiment, from the viewpoint of light emission efficiency, it is preferable to roughen the light emitting surface of the n-type semiconductor layer. As in the case of the first embodiment, light may be emitted through the transparent interlayer insulating film 156 without roughening the surface.

The effect of the image display device 201 of the present embodiment will be described.

The present embodiment also has the same effects as those of the other embodiments described above. That is, because the individual light emitting elements 250 are formed by etching after the semiconductor layer 1150 is bonded together the circuit board 1100, the transfer process of the light emitting elements can be significantly shortened.

In addition to the effects of the other embodiments described above, in the present embodiment, the n-type semiconductor layer 251 can be used as the light emitting surface 251S, so that the surface can be more easily roughened. By connecting the interconnect 260k1 to the light emitting surface 251S, subpixels with high light emission efficiency can be formed.

Third Embodiment

In the present embodiment, an image display device with higher light emission efficiency is realized by forming multiple light emitting surfaces corresponding to multiple light emitting elements in a single semiconductor layer including a light emitting layer. In the following description, the same components as those in the other embodiments described above are denoted by the same reference numerals, and detailed descriptions thereof is omitted as appropriate.

Figure 16:
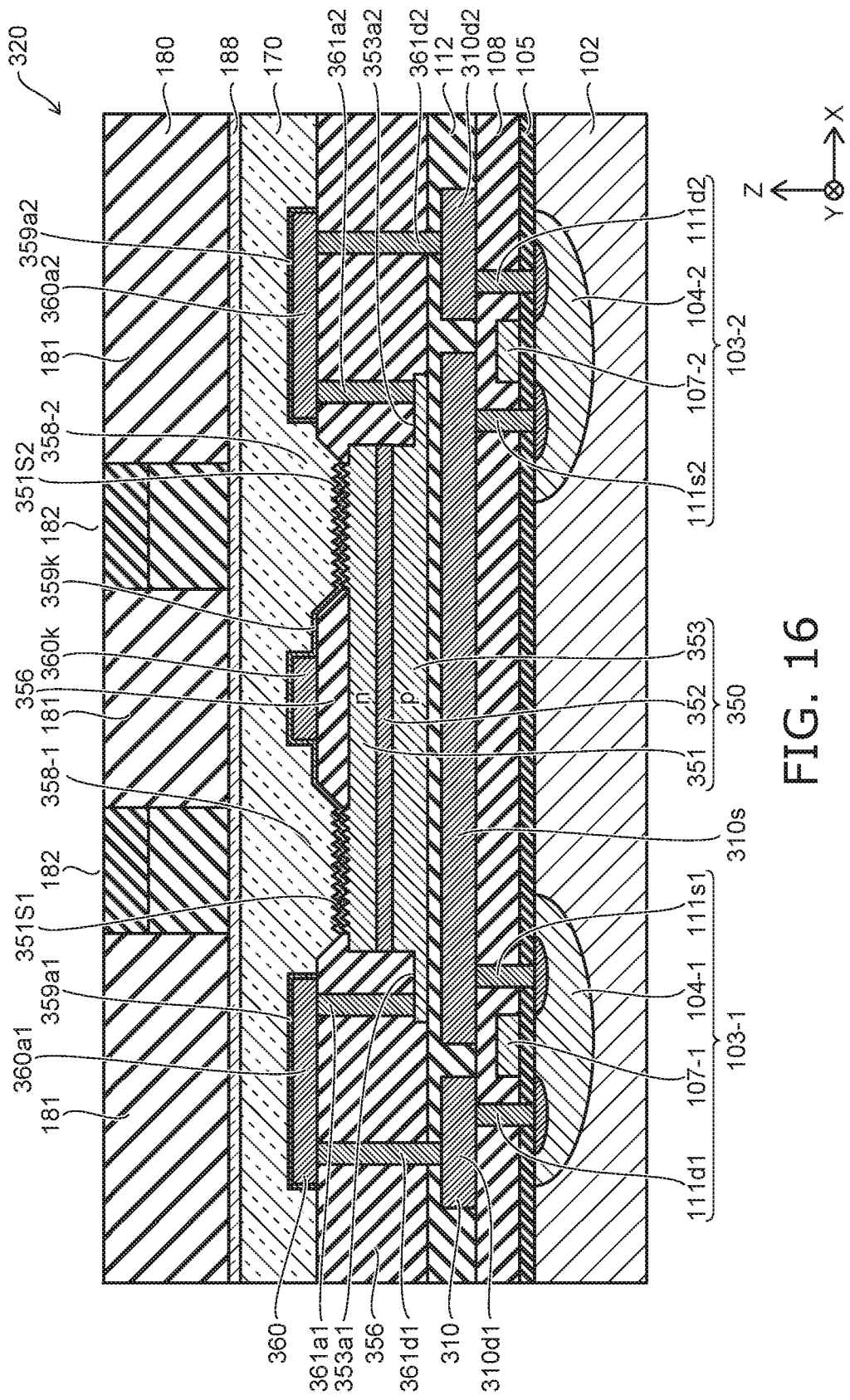
FIG. 16 is a schematic cross sectional view illustrating a portion of an image display device according to a third embodiment.

FIG. 16 is a schematic cross sectional view illustrating a portion of the image display device according to the present embodiment.

As shown in FIG. 16, the image display device includes a subpixel group 320. The subpixel group 320 includes transistors 103-1, 103-2, a first interconnect layer 310, a first interlayer insulating film 112, a semiconductor layer 350, a second interlayer insulating film 356, a second interconnect layer 360, and vias 361d1 and 361d2.

The semiconductor layer 350 includes two light emitting surfaces 351S1 and 351S2, and the subpixel group 320 includes substantially two subpixels. In the present embodiment, as in the other embodiments described above, the display area is formed by arranging subpixel groups 320 including substantially two subpixels in a lattice pattern.

The transistors 103-1 and 103-2 are formed in the element formation regions 104-1 and 104-2, respectively. In this example, the element formation regions 104-1 and 104-2 are n-type semiconductor layers, and a p-type semiconductor layer formed separately from the n-type semiconductor layer is formed. The n-type semiconductor layer includes a channel region, and the p-type semiconductor layer includes a source region and a drain region, respectively.

The insulating layer 105 is formed over the element formation regions 104-1 and 104-2, and gates 107-1 and 107-2 are formed via the insulating layer 105, respectively. Gates 107-1 and 107-2 are the gates of the transistors 103-1 and 103-2. In this example, the transistors 103-1 and 103-2 are p-channel MOSFETs.

The insulating film 108 covers the two transistors 103-1 and 103-2. The interconnect layer (first interconnect layer) 310 is formed on the insulating film 108.

Vias 111s1 and 111d1 are provided between the p-type semiconductor layer of the transistor (first transistor) 103-1 and the interconnect layer 310, respectively. Vias 111s2 and 111d2 are provided between the p-type semiconductor layer of the transistor (second transistor) 103-2 and the interconnect layer 310.

The first interconnect layer 310 includes interconnects 310s, 310d1, and 310d2. The interconnect 310s is electrically connected to the p-type semiconductor layer corresponding to the source electrodes of the transistors 103-1 and 103-2 through the vias 111s1 and 111s2. Although not shown, the interconnect 310s is connected to a power supply line.

The interconnect 310d1 is connected to the p-type semiconductor layer corresponding to the drain electrode of the transistor 103-1 via the via 111d1. The interconnect 310d2 is connected to the drain electrode of the transistor 103-2 through the via 111d2.

The first interlayer insulating film (first insulating film) 112 covers the transistors 103-1 and 103-2 and the interconnect layer 310. The semiconductor layer 350 is provided above the interlayer insulating film 112. The single semiconductor layer 350 is provided between two drive transistors 103-1 and 103-2 arranged along the X-axis direction.

The semiconductor layer 350 includes a p-type semiconductor layer (first semiconductor layer) 353, a light emitting layer 352, and an n-type semiconductor layer (second semiconductor layer) 351. The semiconductor layer 350 is stacked in the order of the p-type semiconductor layer 353, the light emitting layer 352, and the n-type semiconductor layer 351 from the interlayer insulating film 112 side toward the light emitting surfaces 351S1 and 351S2. The p-type semiconductor layer 353 has stepped portions 353a1 and 353a2. The stepped portion 353a1 is provided on the transistor 103-1 side, and the stepped portion 353a2 is provided on the transistor 103-2 side.

The second interlayer insulating film (second insulating film) 356 covers the first interlayer insulating film 112 and the semiconductor layer 350. The interlayer insulating film 356 covers a portion of the semiconductor layer 350. Preferably, the interlayer insulating film 356 covers the surface of the n-type semiconductor layer 351 except for the light emitting surface (exposed surface) 351S1 and 351S2 of the semiconductor layer 350. The interlayer insulating film 356 covers the side surface of the semiconductor layer 350 and the stepped portions 353a1 and 353a2. The interlayer insulating film 356 is preferably a white resin.

A portion of the semiconductor layer 350 that is not covered with the interlayer insulating film 356 is covered with the transparent electrode 359k. The transparent electrode 359k is provided on the light emitting surfaces 351S1 and 351S2 of the n-type semiconductor layer 351 exposed from the openings 358-1 and 358-2 of the interlayer insulating film 356, respectively. The transparent electrode 359k is electrically connected to the n-type semiconductor layer 351.

Vias 361a1 and 361a2 are provided through the interlayer insulating film 356. One end of each of the vias 361a1 and 361a2 is connected to the stepped portions 353a1 and 353a2.

The vias 361d1 and 361d2 are provided through the interlayer insulating films 356 and 112. One end of each of the vias 361d1 and 361d2 are connected to the interconnects 310d1 and 310d2, respectively.

The second interconnect layer (second interconnect layer) 360 is provided on the interlayer insulating film 356. The interconnect layer 360 includes interconnects 360a1 and 360a2. The via (first via) 361d1 is provided between the interconnect (first conductor) 310d1 and the interconnect (second conductor) 360a1. The via (second via) 361d2 is provided between the interconnect (third conductor) 310d2 and the interconnect (fourth conductor) 360a2.

The interconnect 360a1 is connected to the p-type semiconductor layer 353 through the via 361a1. The interconnect 360a2 is connected to the p-type semiconductor layer 353 through the via 361a2. Therefore, the p-type semiconductor layer 353 is connected to the drain electrode of the transistor 103-1 through the interconnect 360a1, the via 361d1, and the interconnect 310d1. The p-type semiconductor layer 353 is connected to the drain electrode of the transistor 103-2 through the interconnect 360a2, the via 361d2, and the interconnect 310d2.

The interconnect layer 360 includes an interconnect 360k. The transparent electrode 359k is provided on the interconnect 360k, and the interconnect 360k and the transparent electrode 359k are electrically connected. The transparent electrode 359k extends to the openings 358-1 and 358-2. The transparent electrode 359k is provided over the entire surface of the light emitting surfaces 351S1 and 351S2 exposed from the openings 358-1 and 358-2, and is electrically connected. Transparent electrodes 359a1 and 359a2 are also provided on the interconnects 360a1 and 360a2, respectively, and are electrically connected to each other.

The opening 358-1 is provided between the interconnects 360a1 and 360k. The opening 358-2 is provided between the interconnects 360k and 360a2. In this example, the interconnect 360k is provided between the openings 358-1 and 358-2. The openings 358-1 and 358-2 are, for example, square or rectangular in the XY plan view. The shape is not limited to a square, and may be a circle, an ellipse, or a polygon such as a hexagon. The light emitting surfaces 351S1 and 351S2 are also square or rectangular, other polygons or circles, etc. in the XY plan view. The shapes of the light emitting surfaces 351S1 and 351S2 may be similar to the shapes of the openings 358-1 and 358-2, or may be different.

As described above, the transparent electrode 359k is connected to the light emitting surfaces 351S1 and 351S2 exposed from the openings 358-1 and 358-2, respectively. Therefore, electrons supplied from the transparent electrode 359k are injected into the n-type semiconductor layer 351 from the exposed light emitting surfaces 351S1 and 351S2. On the other hand, holes are injected into the p-type semiconductor layer 353 from the transistor 103-1 through the interconnect 360a1, the via 361d1, and the interconnect 310d1. Further, holes are injected from the transistor 103-2 into the p-type semiconductor layer 353 through the interconnect 360a2, the via 361d2, and the interconnect 310d2.

Transistors 103-1 and 103-2 are drive transistors of adjacent subpixels, and are sequentially driven. Therefore, holes injected from one of the two transistors 103-1 and 103-2 are injected into the light emitting layer 352, and electrons injected from the interconnect 360k are injected into the light emitting layer 352 to emit light.

Here, because the opening 358-1 is provided between the interconnect 360k and the interconnect 360a1, when the transistor 103-1 is turned on, light is emitted from the light emitting surface 351S1 exposed from the opening 358-1. On the other hand, because the opening 358-2 is provided between the interconnect 360k and the interconnect 360a2, when the transistor 103-2 is turned on, light is emitted from the light emitting surface 351S2 exposed from the opening 358-2.

A method for manufacturing the image display device of the present embodiment will be described.

FIG. 17A to FIG. 18B are schematic cross sectional views illustrating the method for manufacturing the image display device according to the present embodiment.

Figure 17A:
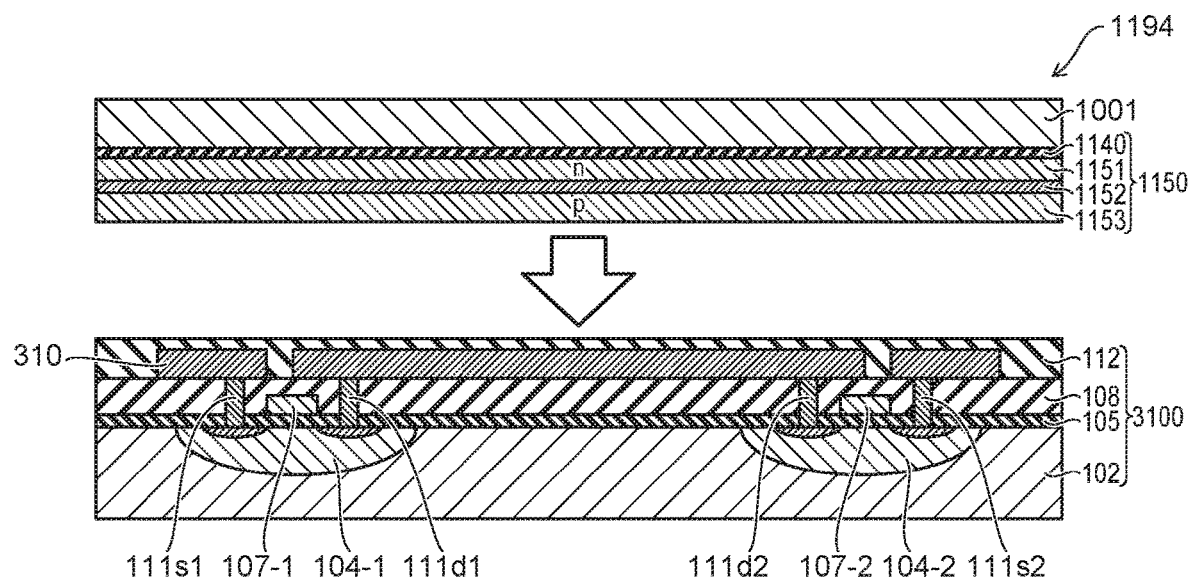
FIG. 17A and FIG. 17B are schematic cross sectional views illustrating a method for manufacturing the image display device of the third embodiment.

As shown in FIG. 17A, a semiconductor growth substrate 1194 including a crystal growth substrate 1001 on which a semiconductor layer 1150 is epitaxially grown is bonded to a circuit board 3100 each other by wafer bonding. The semiconductor layer 1150 and the like on the crystal growth substrate 1001 are the same as those already described in the case of the other embodiments described above, and detailed descriptions thereof is omitted. The circuit board 3100 is also similar in structure to that already described in most other parts, although the circuit configuration is different from that of the other embodiments described above. Hereinafter, only the reference numerals are changed, and detailed description is omitted as appropriate.

Figure 17B:
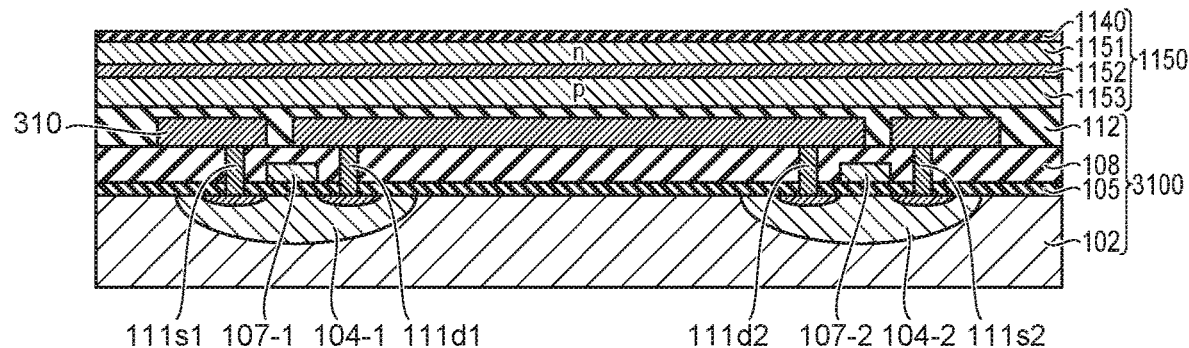

As shown in FIG. 17B, in this example, the surface of the semiconductor layer 1150 opposite to the surface on which the crystal growth substrate 1001 is provided is bonded to the flat surface of the interlayer insulating film 112 of the circuit substrate 3100. That is, the exposed surface of the p-type semiconductor layer 1153 of the semiconductor layer 1150 is bonded to the interlayer insulating film 112.

Figure 18A:
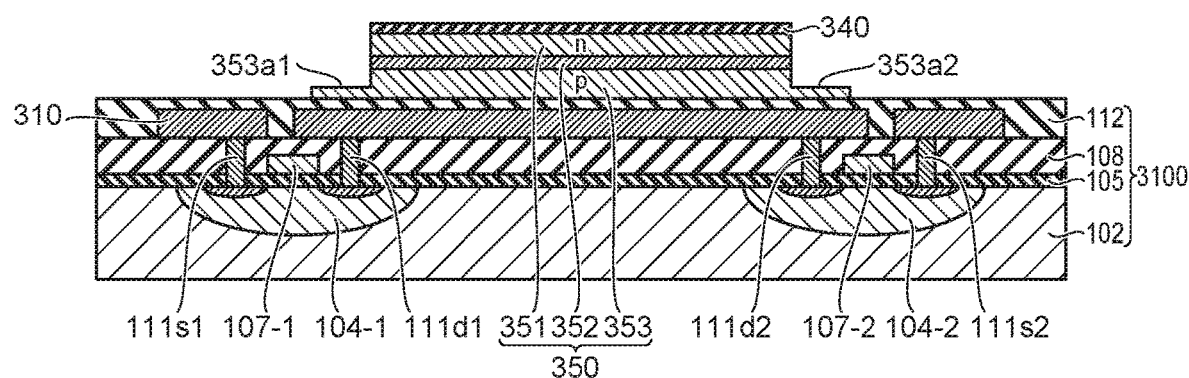
FIG. 18A and FIG. 18B are schematic cross sectional views illustrating a method for manufacturing the image display device of the third embodiment.

As shown in FIG. 18A, the semiconductor layer 1150 is etched to form an end portion of the p-type semiconductor layer 353. Stepped portions 353a1 and 353a2 for via connection are formed at the end of the p-type semiconductor layer 353. The light emitting layer 352 and the n-type semiconductor layer 351 are formed on the p-type semiconductor layer 353 other than the stepped portion.

Thereafter, an interlayer insulating film covering the interlayer insulating film 356 and the semiconductor layer 350 is formed, and a via is formed. Further, the interconnect layer 360 is formed, and the interconnects 360a1, 360k and the like are formed by etching.

Figure 18B:
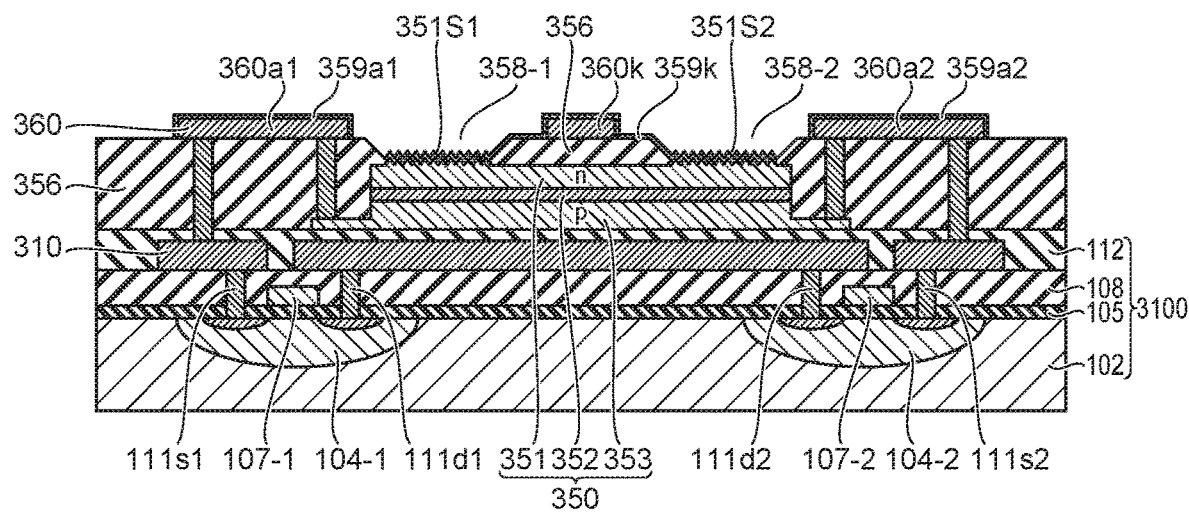

As shown in FIG. 18B, the openings 358-1 and 358-2 are formed in a portion between the interconnects 360a1 and 360k and a portion between the interconnects 360a2 and 360k, respectively. The light emitting surfaces 351S1 and 351S2 of the n-type semiconductor layer exposed by the openings 358-1 and 358-2 are roughened, respectively. Thereafter, the transparent electrodes 359a1, 359a2, and 359k are formed.

In this way, a subpixel having the semiconductor layer 350 sharing the two light emitting surfaces 351S1 and 351S2 is formed.

In the present embodiment, the two light emitting surfaces 351S1 and 351S2 are provided in one semiconductor layer 350. However, the number of light emitting surfaces is not limited to two, and it is possible to provide three or more light emitting surfaces on one semiconductor layer 350. As an example, one column or two columns of subpixels may be realized by a single semiconductor layer 350. As a result, as will be described later, the recombination current that does not contribute to light emission per light emitting surface can be reduced, and the effect of realizing a finer light emitting element can be increased.

(Modification)

Figure 19:
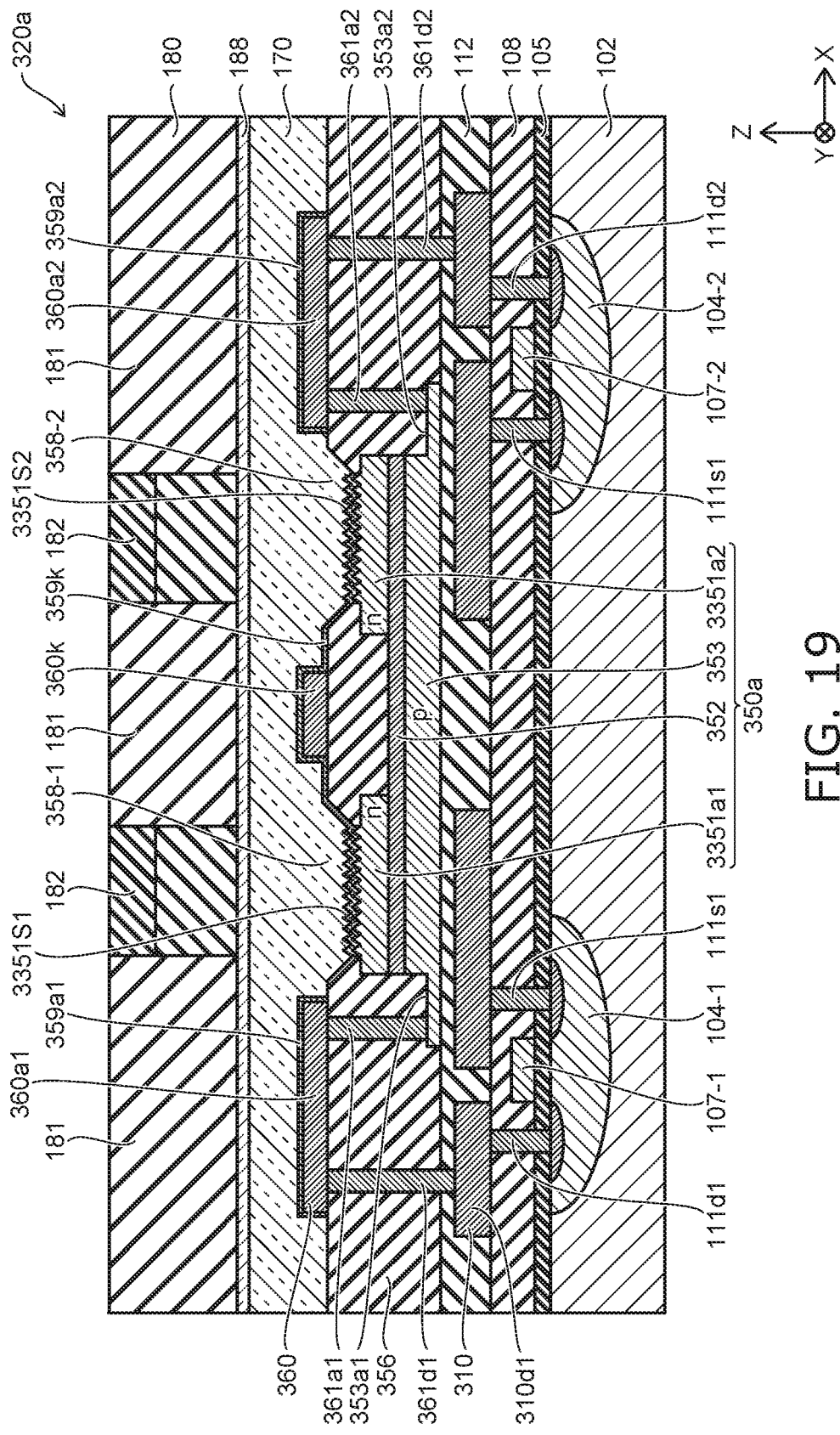
FIG. 19 is a schematic cross sectional view illustrating a portion of a modification of the image display device according to the third embodiment.

FIG. 19 is a schematic cross sectional view illustrating a portion of a modification of the image display device according to the modification of the present embodiment.

The modification is different from the above-described third embodiment in that two n-type semiconductor layers 3351a1 and 3351a2 are provided on the light emitting layer 352. The other points are the same as those in the third embodiment.

As shown in FIG. 19, the image display device according to the modification includes a subpixel group 320a. The subpixel group 320a includes a semiconductor layer 350a. The semiconductor layer 350a includes the p-type semiconductor layer 353, the light emitting layer 352, and n-type semiconductor layers 3351a1 and 3351a2. The p-type semiconductor layer 353, the light emitting layer 352, and the n-type semiconductor layers 3351a1 and 3351a2 are stacked in this order from the interlayer insulating film 356 toward the light-emitting surfaces 3351S1 and 3351S2.

The n-type semiconductor layers 3351a1 and 3351a2 are arranged on the light emitting layer 352 so as to be separated along the X-axis direction. The interlayer insulating film 356 is provided between the n-type semiconductor layers 3351a1 and 3351a2, and the n-type semiconductor layers 3351a1 and 3351a2 are separated by the interlayer insulating film 356. On the interlayer insulating film 356, the interconnect 360k is provided.

The n-type semiconductor layers 3351a1 and 3351a2 have substantially the same shape in the XY plan view, and the shape thereof is substantially square or rectangular, and may be other polygonal shapes, circles, or the like.

The n-type semiconductor layers 3351a1 and 3351a2 have light emitting surfaces 3351S1 and 3351S2, respectively. The light emitting surfaces 3351S1 and 3351S2 are surfaces of the n-type semiconductor layers 3351a1 and 3351a2 exposed through the openings 358-1 and 358-2, respectively.

The shape of the light emitting surfaces 3351S1 and 3351S2 in the XY plan view has substantially the same shape as the shape of the light emitting surface in the third embodiment, and has a shape such as a substantially square shape. The shape of the light emitting surfaces 3351S1 and 3351S2 is not limited to a square shape as in the present embodiment, but may be a polygon such as a circle, an ellipse, or a hexagon. The shapes of the light emitting surfaces 3351S1 and 3351S2 may be similar to the shapes of the openings 358-1 and 358-2, or may be different.

The transparent electrode 359k is provided on the light emitting surface 3351S1. The transparent electrode 359k is also provided on the light emitting surface 3351S2. The transparent electrode 359k is also provided on the interconnect 360k, and the n-type semiconductor layers 3351a1 and 3351a2 are connected to the interconnect 360k via the transparent electrode 359k connected to the light emitting surfaces 3351S1 and 3351S2. Although not shown, the interconnect 360k is connected to the GND line.

Figure 20A:
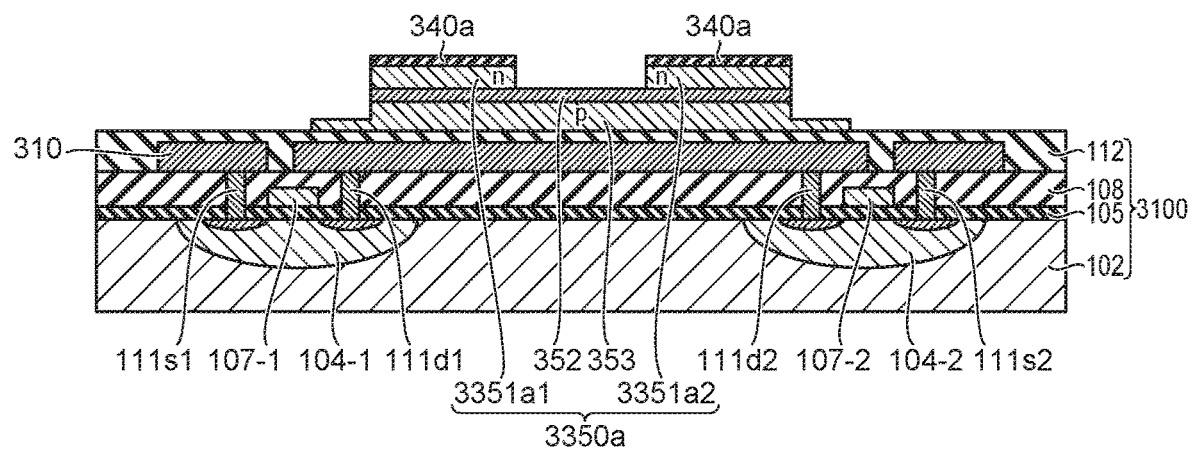
FIG. 20A and FIG. 20B are schematic cross sectional views illustrating a method for manufacturing the modification of the image display device of the third embodiment.
Figure 20B:
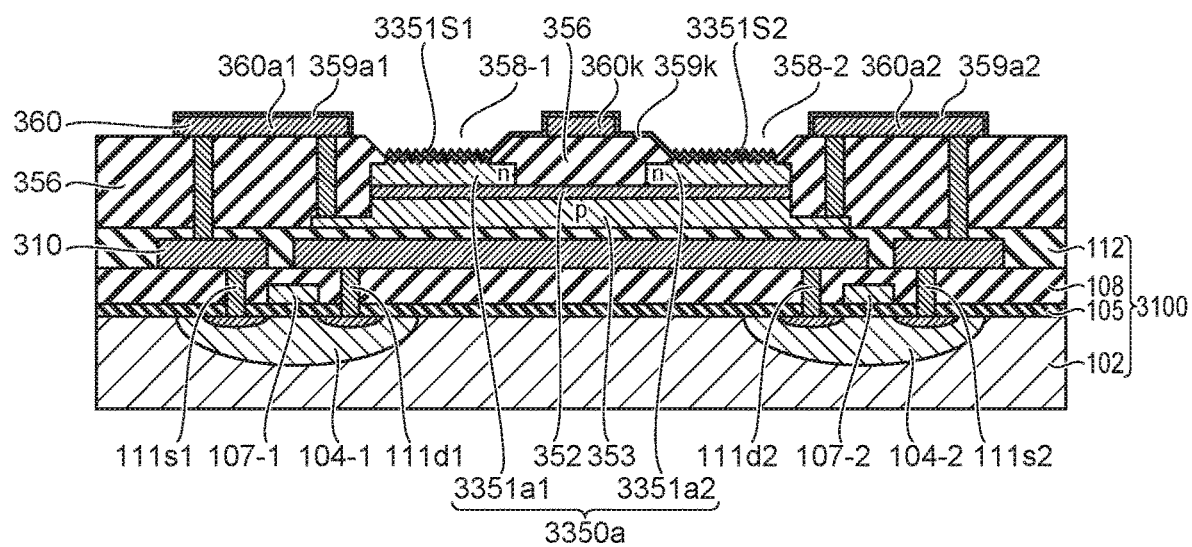

FIG. 20A and FIG. 20B are schematic cross sectional views illustrating the method for manufacturing the image display device according to the modification.

In the modification, until the semiconductor layer 1150 is formed, processes similar to those described in FIG. 17A to FIG. 18A in the case of the third embodiment are employed. Below, the process after that is demonstrated.

As shown in FIG. 20A, in the modification, after the buffer layer 1140, the n-type semiconductor layer 1151, the light-emitting layer 1152, and the p-type semiconductor layer 1153 are etched to form the light emitting layer 352 and the p-type semiconductor layer 353, further, two n-type semiconductor layers 3351a1 and 3351a2 are formed by etching. A buffer layer 340a on the two n-type semiconductor layers 3351a1 and 3351a2 is then removed. The buffer layer 340a may be removed before the n-type semiconductor layers 3351a1 and 3351a2 are etched, depending on the state of the manufacturing process to be used.

The n-type semiconductor layers 3351a1 and 3351a2 may be formed by etching more deeply. For example, the etching for forming the n-type semiconductor layers 3351a1 and 3351a2 may be performed until reaching the depth in the light emitting layer 352 or the p-type semiconductor layer 353. Thus, when the n-type semiconductor layer is etched deeply, it is desirable that the etching position of the n-type semiconductor layer 351 is separated from the light emitting surfaces 3351S1 and 3351S2 of the n-type semiconductor layer described later by 1 μm or more. The recombination current can be suppressed by separating the etching position from the light emitting surfaces 3351S1 and 3351S2.

As shown in FIG. 20B, an interlayer insulating film covering interlayer insulating film 112 and semiconductor layer 3350a is formed, and then a via is formed. Further, the interconnect layer 360 is formed, and the interconnects 360a1, 360k and the like are formed by etching.

The openings 358-1 and 358-2 are formed in the interlayer insulating film, respectively. The light emitting surfaces 3351S1 and 3351S2 of the n-type semiconductor layer exposed by the openings 358-1 and 358-2 are roughened, respectively. Thereafter, the transparent electrodes 359a1, 359a2, and 359k are formed.

In this manner, the subpixel group 320a having two light emitting surfaces 3351S1 and 3351S2 is formed.

Also in the case of the modification, the number of light emitting surfaces is not limited to two as in the case of the third embodiment, and three or more light emitting surfaces may be provided in one semiconductor layer 3350.

The effect of the image display device of the present embodiment will be described.

Figure 21:
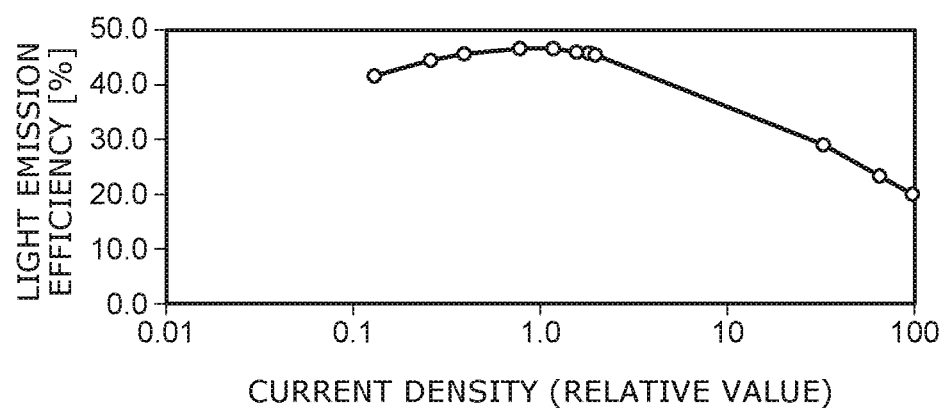
FIG. 21 is a graph illustrating characteristics of a pixel LED.

FIG. 21 is a graph illustrating characteristics of the pixel LED.

The vertical axis in FIG. 21 represents light emission efficiency [%]. The horizontal axis represents the current density of a current flowing through the pixel LED as a relative value.

As shown in FIG. 21, in the region where the relative value of the current density is smaller than 1.0, the light emission efficiency of the pixel LED is almost constant or increases monotonously. In the region where the relative value of the current density is larger than 1.0, the light emission efficiency decreases monotonously. That is, the pixel LED has an appropriate current density that maximizes the light emission efficiency.

It is expected that a highly efficient image display device can be realized by suppressing the current density to such an extent that sufficient luminance can be obtained from the light emitting element. However, FIG. 21 shows that the light emission efficiency tends to decrease as the current density decreases at a low current density.

As described in the first embodiment and the second embodiment, the light emitting element is formed by individually separating all layers of the semiconductor layer 1150 including the light emitting layer by etching or the like. At this time, the bonding surface between the light emitting layer and the n-type semiconductor layer is exposed at the end portion. Similarly, the bonding surface between the light emitting layer and the p-type semiconductor layer is exposed at the end portion.

When such an end exists, electrons and holes recombine at the end portion. On the other hand, such recombination does not contribute to light emission. The recombination at the end portion occurs almost independently of the current flowing through the light emitting element. The recombination is considered to occur according to the length of the bonding surface that contributes to the light emission at the end portion.

When two light emitting elements having a cubic shape having the same size are caused to emit light, the end portions are formed in four directions for each light emitting element, and therefore, recombination may occur at a total of eight end portions.

In contrast, in the present embodiment, the semiconductor layers 350, 350a, and 3350a having two light emitting surfaces have four end portions. The region between the openings 358-1 and 358-2 has few injections of electrons and holes and hardly contributes to light emission. Therefore, it can be considered that there are six end portions contributing to light emission. Thus, in the present embodiment, the number of end portions is substantially reduced, so that recombination that does not contribute to light emission can be reduced, and it becomes possible to reduce the drive current accordingly.

When the distance between subpixels is shortened or the current density is relatively high for high definition or the like, in the subpixel group 320 of the third embodiment, the distance between the light emitting surfaces 351S1 and 351S2 becomes shorter. In this case, if the n-type semiconductor layer 351 is shared, a portion of the electrons injected to the adjacent light emitting surface may be diverted, and the light emitting surface on the side that is not driven may slightly emit light. In the modification, because the n-type semiconductor layer is separated for each light emitting surface, generation of slight light emission on the light emitting surface that is not driven can be reduced.

In the present embodiment, the semiconductor layer including the light emitting layer is formed by stacking the p-type semiconductor layer, the light emitting layer, and the n-type semiconductor layer in this order from the interlayer insulating film side, and the exposed surface of the n-type semiconductor layer is roughened. This is preferable from the viewpoint of improving the light emission efficiency. As in the case of the first embodiment, the stacking order of the p-type semiconductor layer and the n-type semiconductor layer may be changed, and the n-type semiconductor layer, the light emitting layer, and the p-type semiconductor layer may be stacked in this order.

Fourth Embodiment

The image display device described above can be, for example, a computer display, a portable terminal such as a TV or a smartphone, or a car navigation as an image display module having an appropriate number of pixels.

Figure 22:
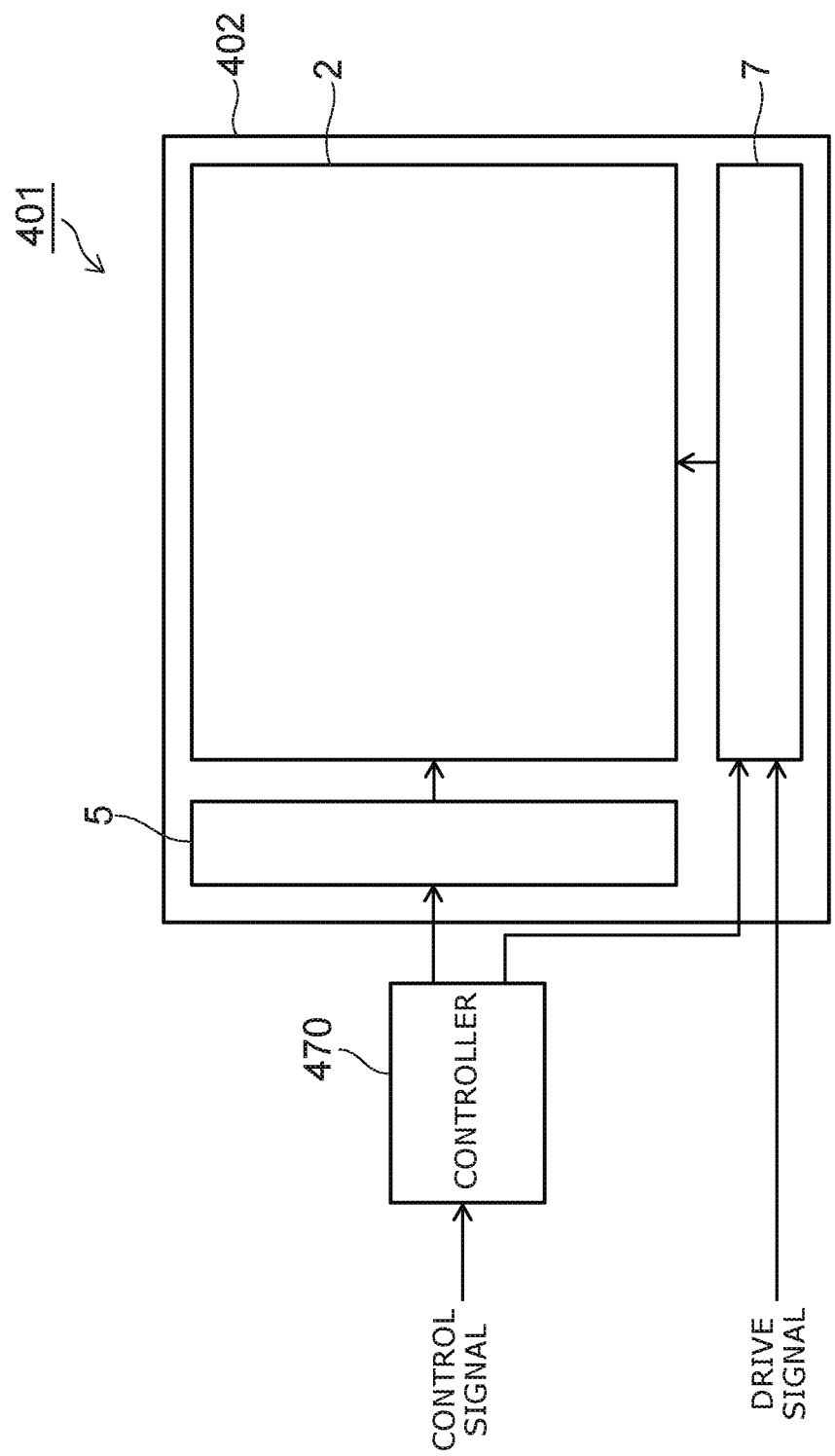
FIG. 22 is a block diagram illustrating an image display device according to a fourth embodiment.

FIG. 22 is a block diagram illustrating an image display device according to the present embodiment.

FIG. 22 shows a main part of the configuration of the computer display.

As shown in FIG. 22, an image display device 401 includes an image display module 402. The image display module 402 is an image display device having the configuration of the first embodiment described above, for example. The image display module 402 includes the display area 2 in which the subpixels 20 are arranged, the row selection circuit 5, and the signal voltage output circuit 7.

The image display device 401 further includes a controller 470. The controller 470 receives control signals separated and generated by an interface circuit (not shown), and controls the drive and drive sequence of the subpixels with respect to the row selection circuit 5 and the signal voltage output circuit 7.

(Modification)

Figure 23:
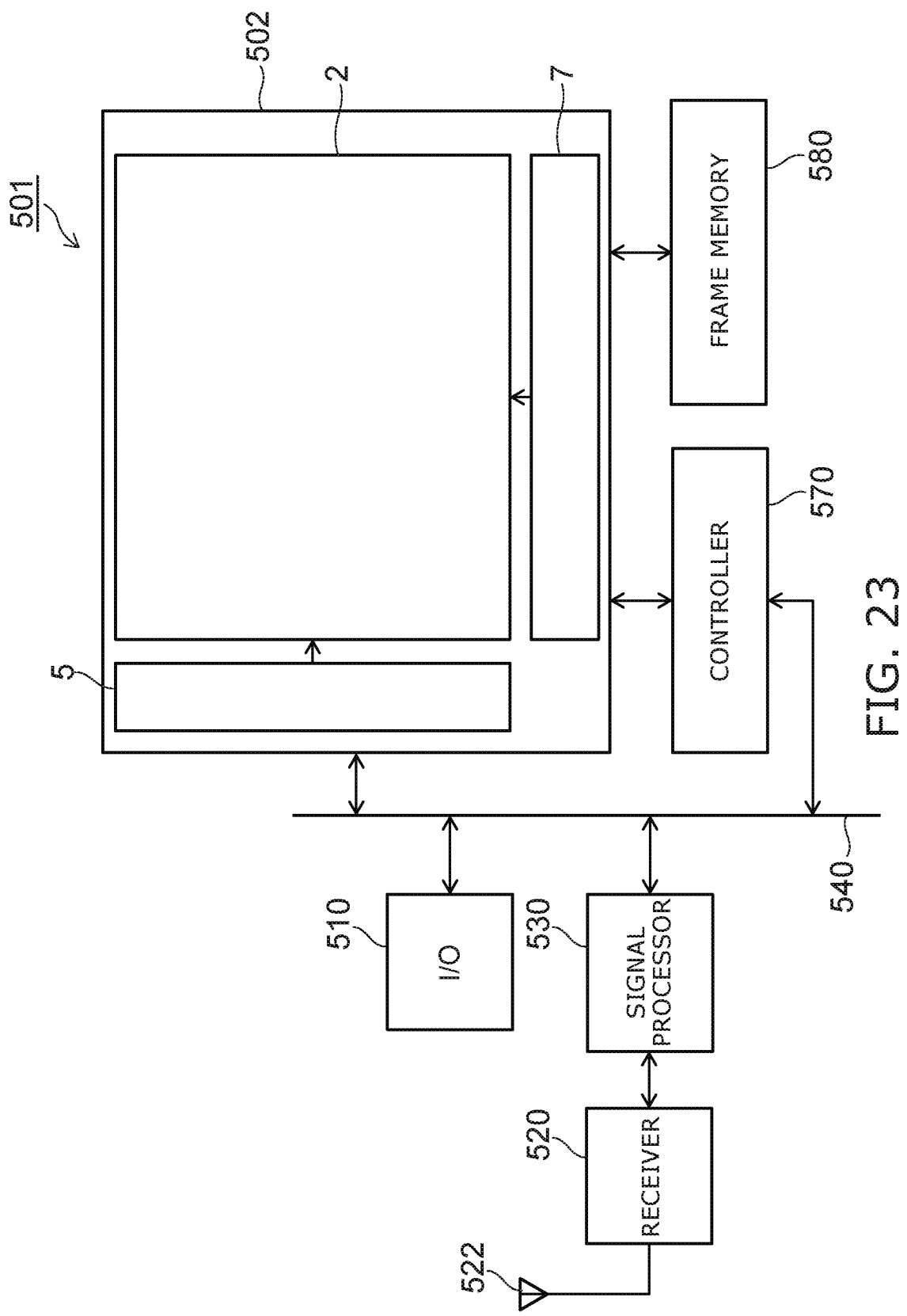
FIG. 23 is a block diagram illustrating a modification of the image display device according to the fourth embodiment.

FIG. 23 is a block diagram illustrating an image display device according to the modification.

FIG. 23 shows the configuration of a high-definition thin TV.

As shown in FIG. 23, an image display device 501 includes an image display module 502. The image display module 502 is, for example, the image display device 1 having the configuration in the case of the first embodiment described above. The image display device 501 includes a controller 570 and a frame memory 580. The controller 570 controls the driving order of the subpixels in the display area 2 based on the control signal supplied by a bus 540. The frame memory 580 stores display data for one frame and is used for processing such as smooth moving image reproduction.

The image display device 501 has an I/O circuit 510. The I/O circuit 510 provides an interface circuit or the like for connecting to an external terminal or device. The I/O circuit 510 includes, for example, a USB interface for connecting an external hard disk device or the like, an audio interface, or the like.

The image display device 501 includes a tuner 520 and a signal processing circuit 530. An antenna 522 is connected to the tuner 520, and a necessary signal is separated from a radio wave received by the antenna 522 and generated. The signal processing circuit 530 includes a DSP (Digital Signal Processor), a CPU (Central Processing Unit), and the like. The signal separated and generated by the tuner 520 is separated into image data, audio data, and the like by the signal processing circuit 530, and generated.

By using the tuner 520 and the signal processing circuit 530 as a high-frequency communication module such as a cellular phone transmission/reception device, WiFi device, or GPS receiver, another image display device can be obtained. For example, an image display device including an image display module having an appropriate screen size and resolution can be a portable information terminal such as a smartphone or a car navigation system.

The image display module in the case of the present embodiment is not limited to the configuration of the image display device in the case of the first embodiment, and may be modified examples thereof or other embodiments.

Figure 24:
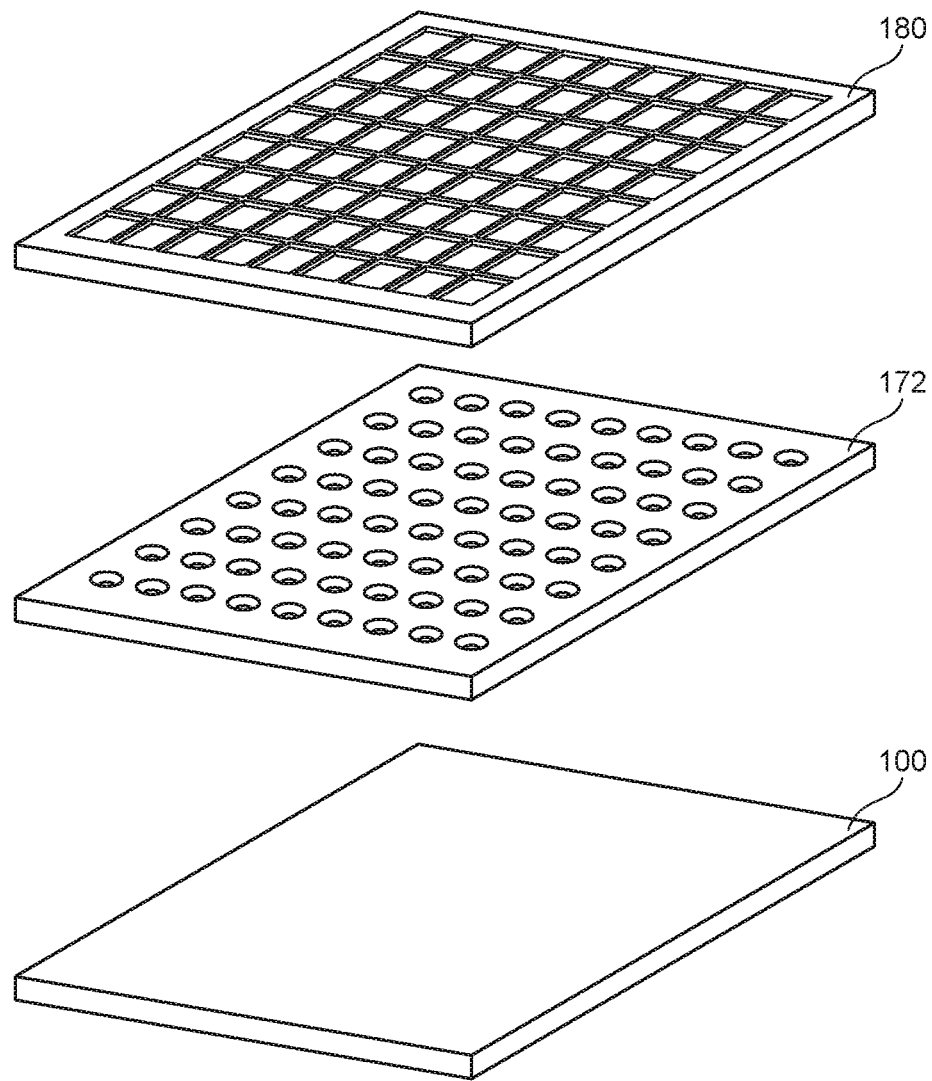
FIG. 24 is a perspective view illustrating each of the image display devices of the first to the third embodiment and the modifications.

FIG. 24 is a perspective view illustrating each of the image display devices of the first to the third embodiment and the modifications.

As shown in FIG. 24, in each of the image devices of the first to the third embodiment, the light emitting circuit portion 172 which has a lot of subpixels is provided on the circuit substrate 100. The color filter 180 is provided on the circuit substrate 100. In the fourth embodiment and the modification, structures including the circuit substrates 100, the light emitting circuit portions 172 and the color filters 180 are image display modules 402, 502, which are built in the image displays respectively.

According to the embodiment described above, it is possible to realize a method of manufacturing an image display device and an image display device that shorten the transfer process of the light emitting elements and improve the yield.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A method for manufacturing an image display device, the method comprising:

preparing a substrate, the substrate comprising a semiconductor layer, the semiconductor layer comprising a light emitting layer, the semiconductor layer being formed on a first substrate;

removing the first substrate;

after removing the first substrate, bonding the semiconductor layer to a second substrate, the second substrate comprising a circuit that comprises a circuit element;

forming a light emitting element by etching the semiconductor layer;

forming an insulating film covering the light emitting element;

forming a via reaching the circuit through the insulating film; and electrically connecting the light emitting element and the circuit element through the via, the via connecting the light emitting element and the circuit element provided in different layers.

2. The method according to claim 1, further comprising: exposing a surface of the light emitting element.

3. The method according to claim 2, further comprising: forming a transparent electrode on the exposed surface of the light emitting element.

4. The method according to claim 1, wherein the semiconductor layer is grown on a buffer layer formed on the first substrate.

5. The method according to claim 4, wherein the buffer layer comprises a nitride.

6. The method according to claim 1, wherein the first substrate comprises silicon or sapphire.

7. The method according to claim 1, wherein:
the semiconductor layer comprises a gallium nitride-based compound semiconductor, and the second substrate comprises silicon.

8. The method according to claim 1, further comprising: forming a wavelength conversion member on the light emitting element.

* * * * *